US007698354B2

(12) United States Patent
Hennedy et al.

(10) Patent No.: US 7,698,354 B2
(45) Date of Patent: *Apr. 13, 2010

(54) PROGRAMMABLE ENGINE CORE FOR EXECUTING DIGITAL SIGNAL PROCESSING FUNCTIONS

(75) Inventors: Michael Hennedy, Holmdel, NJ (US); Ahmed Shalash, Old Bridge, NJ (US)

(73) Assignee: Analog Devices, Inc., Norwood, MA (US)

( * ) Notice: Subject to any disclaimer, the term of this patent is extended or adjusted under 35 U.S.C. 154(b) by 1315 days.

This patent is subject to a terminal disclaimer.

(21) Appl. No.: 11/061,353

(22) Filed: Feb. 18, 2005

(65) Prior Publication Data

US 2005/0251542 A1  Nov. 10, 2005

Related U.S. Application Data

(60) Provisional application No. 60/563,032, filed on Apr. 16, 2004.

(51) Int. Cl.
*G06F 17/10* (2006.01)

(52) U.S. Cl. .................................................... 708/300

(58) Field of Classification Search ........................ None
See application file for complete search history.

(56) References Cited

U.S. PATENT DOCUMENTS

| | | | |
|---|---|---|---|
| 4,491,910 A | 1/1985 | Caudel et al. ................. | 712/42 |
| 4,959,815 A | 9/1990 | Wada .................... | 365/230.06 |
| 5,047,972 A | 9/1991 | Wada ......................... | 708/319 |
| 5,243,551 A | 9/1993 | Knowles et al. .......... | 364/750.5 |
| 5,432,723 A | 7/1995 | Chen et al. ............. | 364/724.01 |
| 5,500,811 A | 3/1996 | Corry .................... | 364/724.16 |
| 6,263,354 B1 | 7/2001 | Gandhi ....................... | 708/320 |
| 6,279,019 B1 | 8/2001 | Oh et al. ..................... | 708/300 |
| 6,314,393 B1 | 11/2001 | Zheng et al. ................ | 704/223 |
| 6,823,353 B2 | 11/2004 | Fischer et al. ............... | 708/622 |
| 6,952,709 B1 | 10/2005 | Dujardin et al. ............. | 708/300 |
| 2002/0013798 A1 | 1/2002 | Willson, Jr. et al. ......... | 708/319 |
| 2002/0161806 A1 | 10/2002 | Shaikh ....................... | 708/300 |
| 2004/0101039 A1 | 5/2004 | Glendenning ............... | 375/232 |

(Continued)

OTHER PUBLICATIONS

United States Office Action, dated Dec. 21, 2007, U.S. Appl. No. 10/871,794, filed Jun. 18, 2004.

(Continued)

*Primary Examiner*—David H Malzahn
(74) *Attorney, Agent, or Firm*—Sunstein Kann Murphy & Timbers LLP

(57) ABSTRACT

A flexible engine for implementing digital signal processing (DSP) functions involving repeating various arithmetic/logical operations on a stream of data includes multiple programmable filter elements, at least one of which includes a microcode control program for internal control of the programmable filter element. The engine also includes programmable interconnection logic coupled to the programmable filter elements for selectively combining, scaling, and accumulating output values from the first plurality of programmable filter elements and selectively providing accumulated values as inputs to the first plurality of programmable filter elements. A filter controller coupled to the programmable filter elements and the programmable interconnection logic includes its own microcode control program for external control of the programmable filter elements and the programmable interconnection logic. Multiple engines can be combined to form larger, more powerful engines.

23 Claims, 20 Drawing Sheets

U.S. PATENT DOCUMENTS

2004/0181564 A1 9/2004 MacInnis et al. ............ 708/322
2005/0251542 A1 11/2005 Hennedy et al. ............ 708/300
2005/0283509 A1 12/2005 Hennedy et al. ............ 708/300
2007/0050438 A1* 3/2007 Samuel et al. ............... 708/300

OTHER PUBLICATIONS

United States Office Action, dated Nov. 09, 2007, U.S. Appl. No. 10/871,411.
Amendment in Response to the Office Action of Mar. 29, 2007 in U.S. Appl. No. 10/871,509; dated Jul. 30, 2007.
United States Office Action, dated Nov. 09, 2007, U.S. Appl. No. 10/871,411.
Amendment in Response to the Office Action of Nov. 9, 2007 in U.S. Appl. No. 10/871,411, dated Feb. 8, 2008.
Request for Continued Examination in U.S. Appl. No. 10/871,794, dated Aug. 18, 2008.
United States Office Action, dated May 16, 2008, U.S. Appl. No. 10/871,794.
Amendment in Response to the Office Action of Dec. 21, 2007 in U.S. Appl. No. 10/871,794, dated Mar. 21, 2008.

* cited by examiner

Data Fetch/Store (DFS)

Address Generator (ADG)

Post-Twiddle and Gain-Scale in FFT

Timeline of Twiddle/GainScale Pipeline in FFT

Radix-2/4 Butterfly Engine with Twiddle Function

FIG. 16 GainScale & Windowing DataPath

PROGRAMMABLE ENGINE CORE FOR EXECUTING DIGITAL SIGNAL PROCESSING FUNCTIONS

PRIORITY

This application claims priority from U.S. Provisional Patent Application No. 60/563,032 entitled PROGRAMMABLE ENGINE CORE FOR EXECUTING DIGITAL SIGNAL PROCESSING FUNCTIONS, filed on Apr. 16, 2004 in the names of Michael Hennedy and Ahmed Shalash, which is hereby incorporated herein by reference in its entirety.

FIELD OF THE INVENTION

The present invention relates generally to digital signal processing, and more particularly to a programmable engine core for executing digital signal processing functions.

BACKGROUND OF THE INVENTION

The algorithmic implementation of many digital signal processing (DSP) functions involves repeating various arithmetic/logical operations on a stream of data. Typical digital signal processing functions include Fast Fourier Transform (FFT), Inverse Fast Fourier Transform (IFFT), pre- and post-twiddling, complex gain-scaling, and barrel-shifting.

SUMMARY OF THE INVENTION

Embodiments of the present invention provide a flexible engine for implementing digital signal processing (DSP) functions involving repeating various arithmetic/logical operations on a stream of data.

DETAILED DESCRIPTION OF A PREFERRED EMBODIMENT

Figure 1:
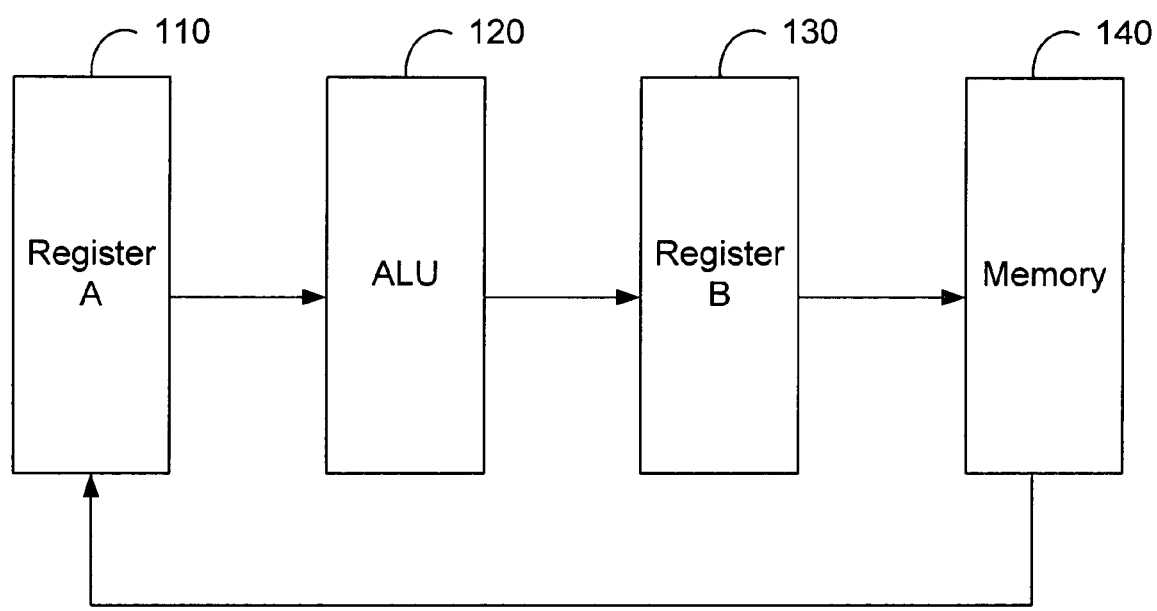
FIG. 1 is a conceptual block diagram of a programmable engine core in accordance with an embodiment of the present invention.

FIG. 1 is a conceptual block diagram of a programmable engine core in accordance with an embodiment of the present invention. Among other things, the programmable engine core includes a first register 110 (referred to as Register A), an arithmetic/logic unit (ALU) 120, a second register 130 (referred to as Register B), and a memory 140. The ALU 120 is programmed, configured, or otherwise designed to perform one or more algorithmic functions. Data can be moved from the memory 140 to Register A 110 to be operated upon by the engine core. A "move" instruction causes the data to be moved from Register A 110 through the ALU 120 to Register B 130, whereby the ALU 120 performs its predetermined algorithmic function(s) on the data. The data can be moved from Register B 130 into the memory 140.

Figure 2:
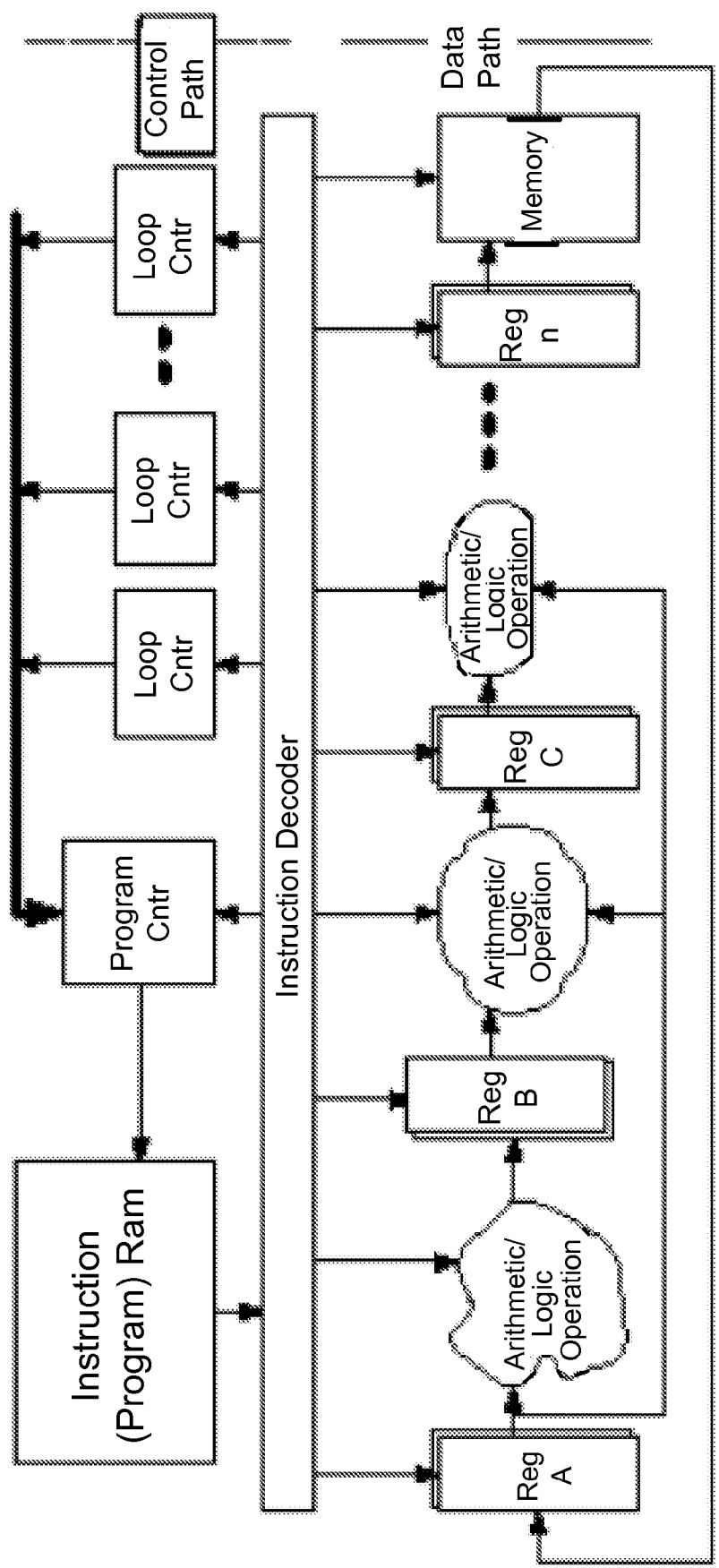
FIG. 2 is another conceptual block diagram showing additional details of a programmable engine core in accordance with an exemplary embodiment of the present invention.

In practice, a programmable engine core can be created with virtually any number of registers and ALUs. FIG. 2 is another conceptual block diagram showing additional details of a programmable engine core in accordance with an exemplary embodiment of the present invention. Generally speaking, the programmable engine core includes a control path and a data path. The control path includes an instruction (program) random-access memory (RAM), a program controller, a number of loop controllers, and an instruction decoder. The data path includes various registers, ALUs, and memory. The number of ALUs can be varied according to the needs of a particular implementation. In this example, the data path includes a feed-forward of Register A to all ALUs such that, for example, the first (leftmost) ALU can operate on the contents from Register A and store the result in Register B, the second ALU can operate on the contents from Register B and/or the contents of Register A and store the result in Register C, and the third ALU can operate on the contents from Register C and/or Register A and store the result in the subsequent register. It should be noted that such feed-forwards are not a requirement of the present invention. It should also be noted that feed-backs may be provided so that a particular ALU can operate on the output of a subsequent register.

Referring still to the programmable engine core of FIG. 2, a simple instruction set is typically used to control the operation of the engine. The simple instruction set is typically based on executable micro-code. The type of algorithm performed is determined by the ALUs (also referred to hereinafter as arithmetic units or AUs). The steady-state operation of the engine involves executing "move" instructions to move data from register to register through one or more arithmetic/logic units. In the course of performing the "move" instruction, data is operated upon by the arithmetic/logic unit in its path.

The control path provides two types of control, namely setup and datapath control for configuring and altering the ALUs for the desired algorithmic function, and timing control for executing either bounded loops (e.g., as typically used for FFT computations) or indefinite loops. Multiple nested loop counters are typically used for timing control.

It should be noted that multiple algorithms can typically be implemented by the same engine, provided the ALUs contain the necessary hardware for the various algorithms and provided multiple code segments are stored in the program memory (i.e., one for each algorithm). It should be noted that the ALUs are not required to be identical.

Figure 3:
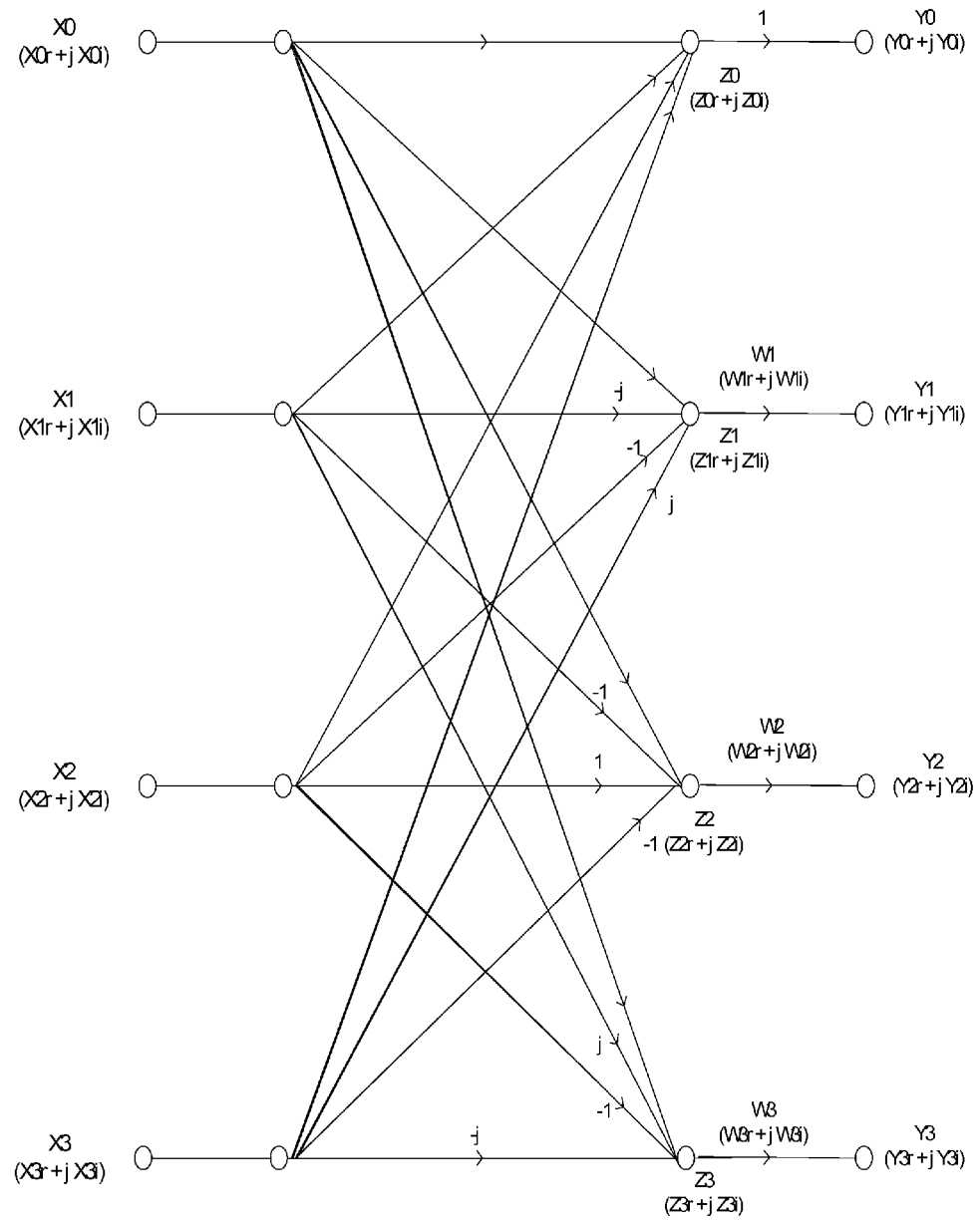
FIG. 3 shows the Radix-4 butterfly as known in the art.

Various embodiments of the present invention will be described with reference to a programmable engine core designed for efficient implementation of Radix-2 and Radix-4 in-place butterfly computations and corresponding "twiddle" operations. For convenience, the programmable engine core may be referred to hereinafter as ER4. The following discussion focuses mainly on the Radix-4 capabilities. FIG. 3 shows the Radix-4 butterfly as known in the art.

Figure 4:
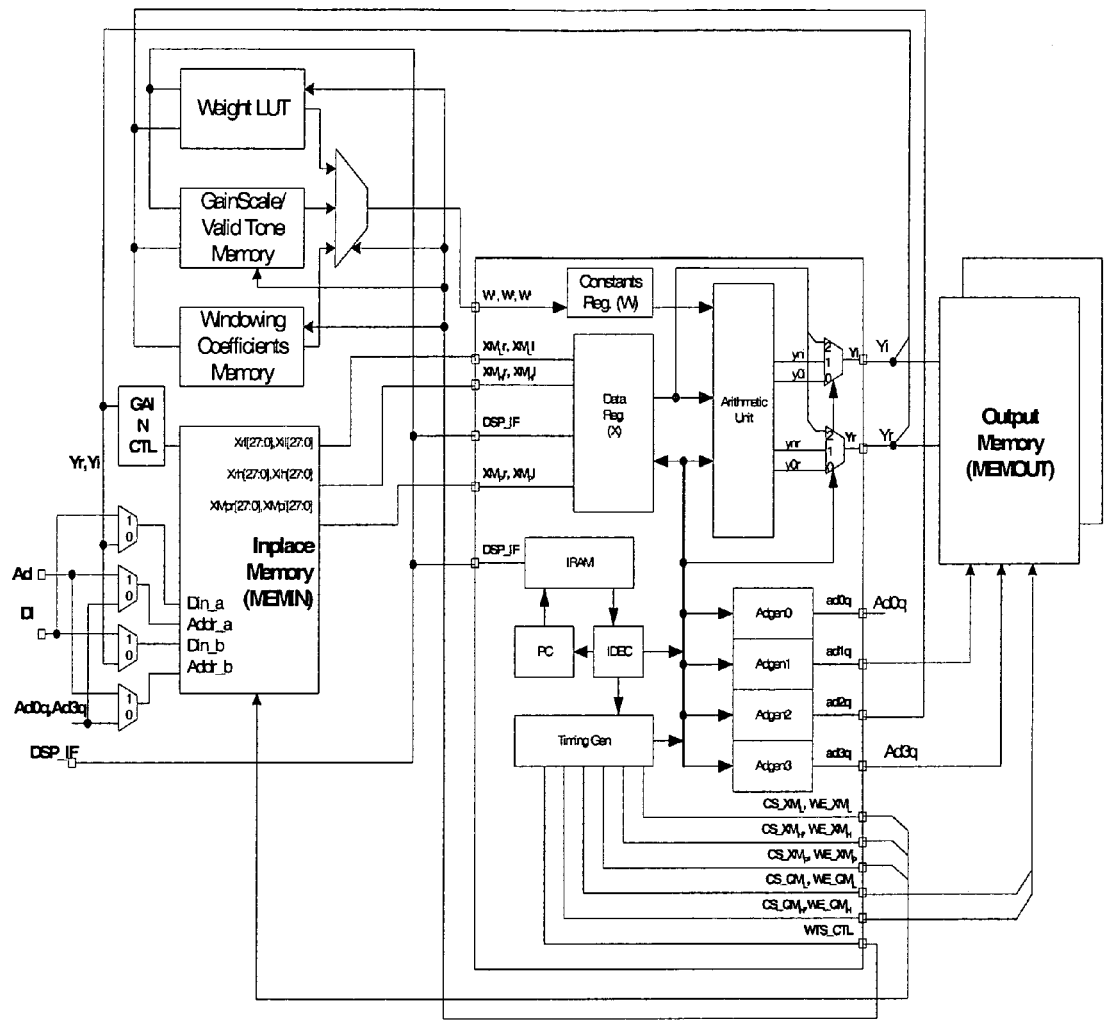
FIG. 4 shows the programmable engine core configured for FFT/IFFT operation in accordance with an embodiment of the present invention.
Figure 5:
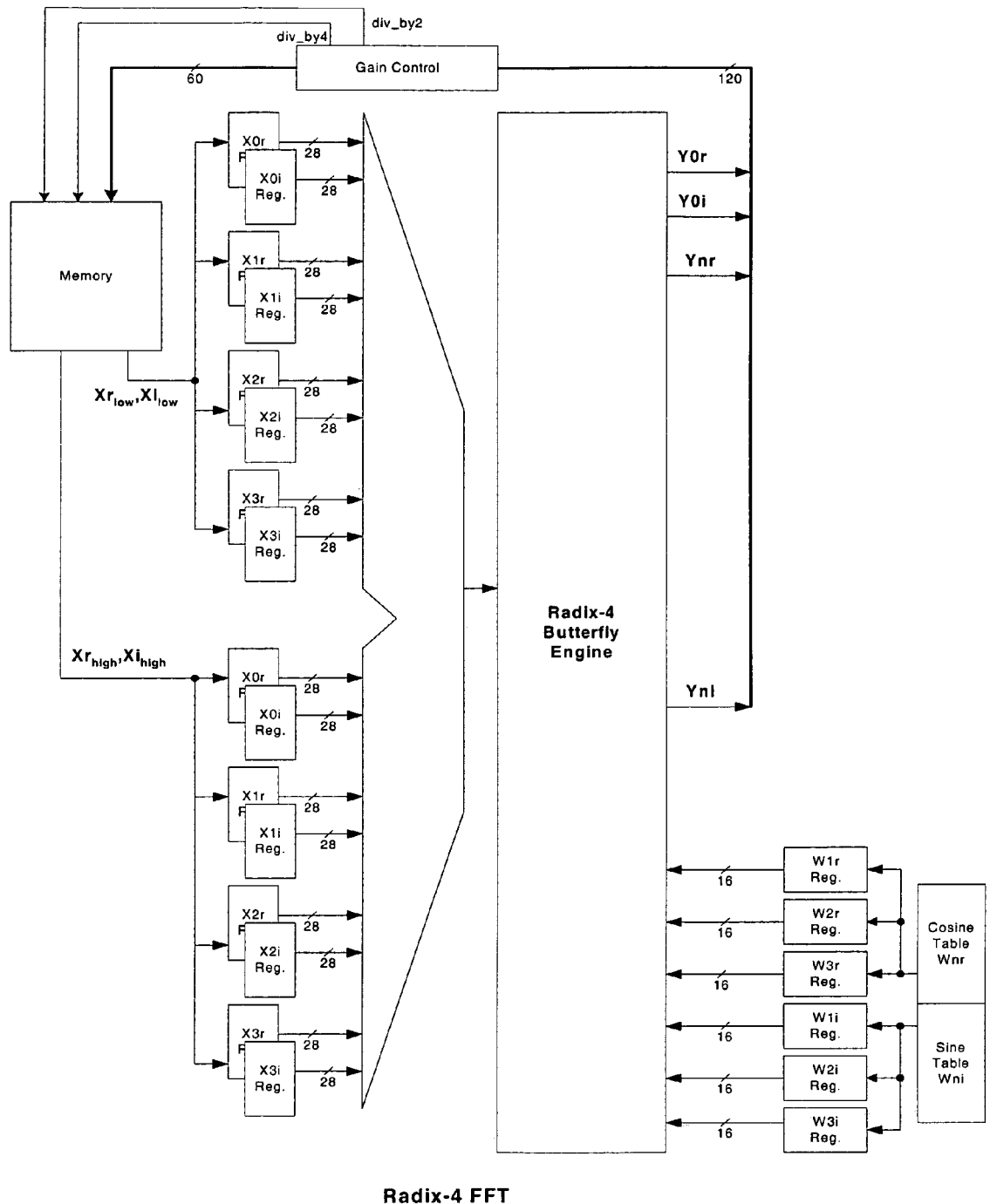
FIG. 5 shows an overview of a digital signal processing engine for performing a Radix-4 butterfly operation in accordance with an embodiment of the present invention.
Figure 7:
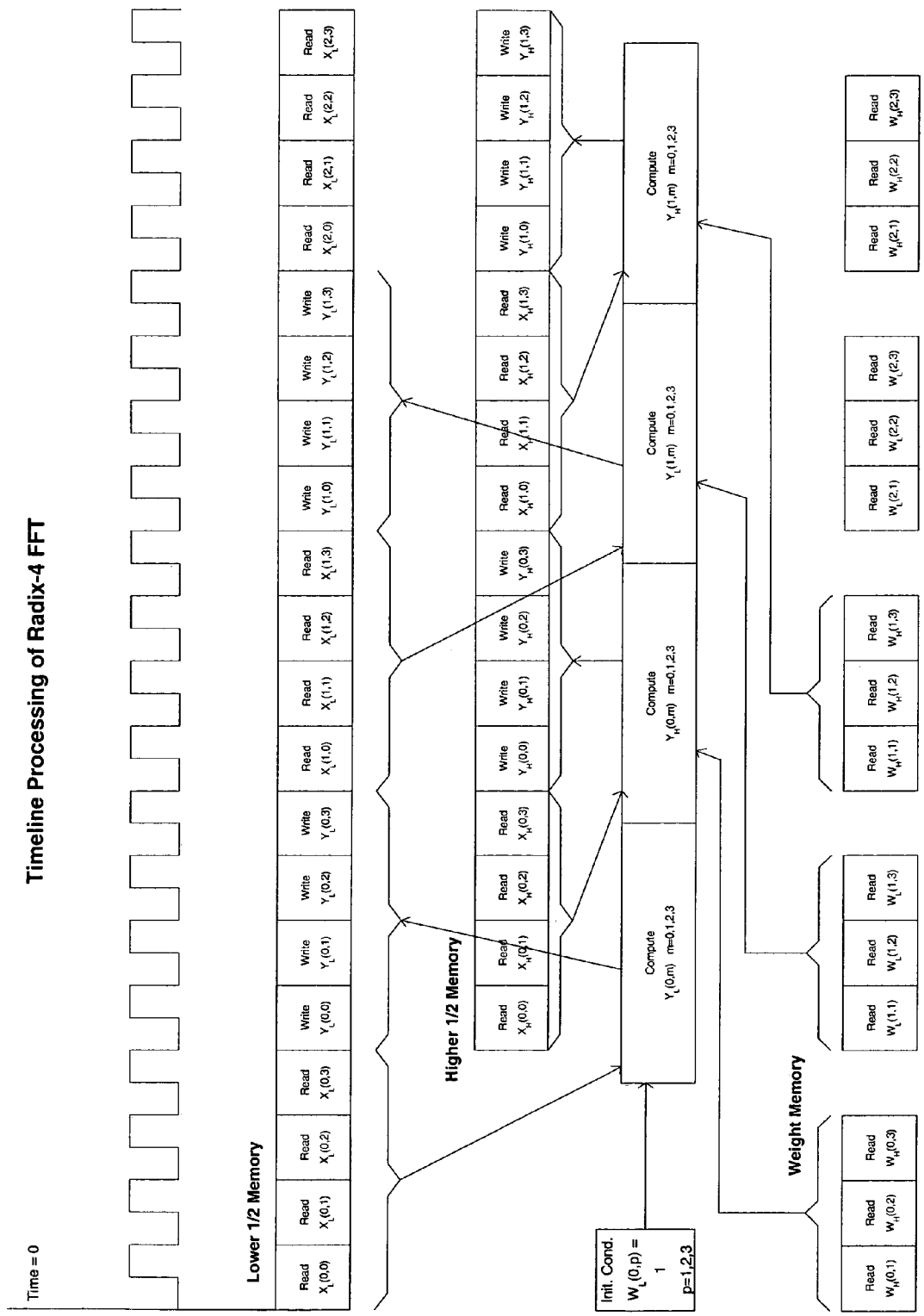
FIG. 7 shows a first timeline for performing a Radix-4 FFT in accordance with an embodiment of the present invention.
Figure 8:
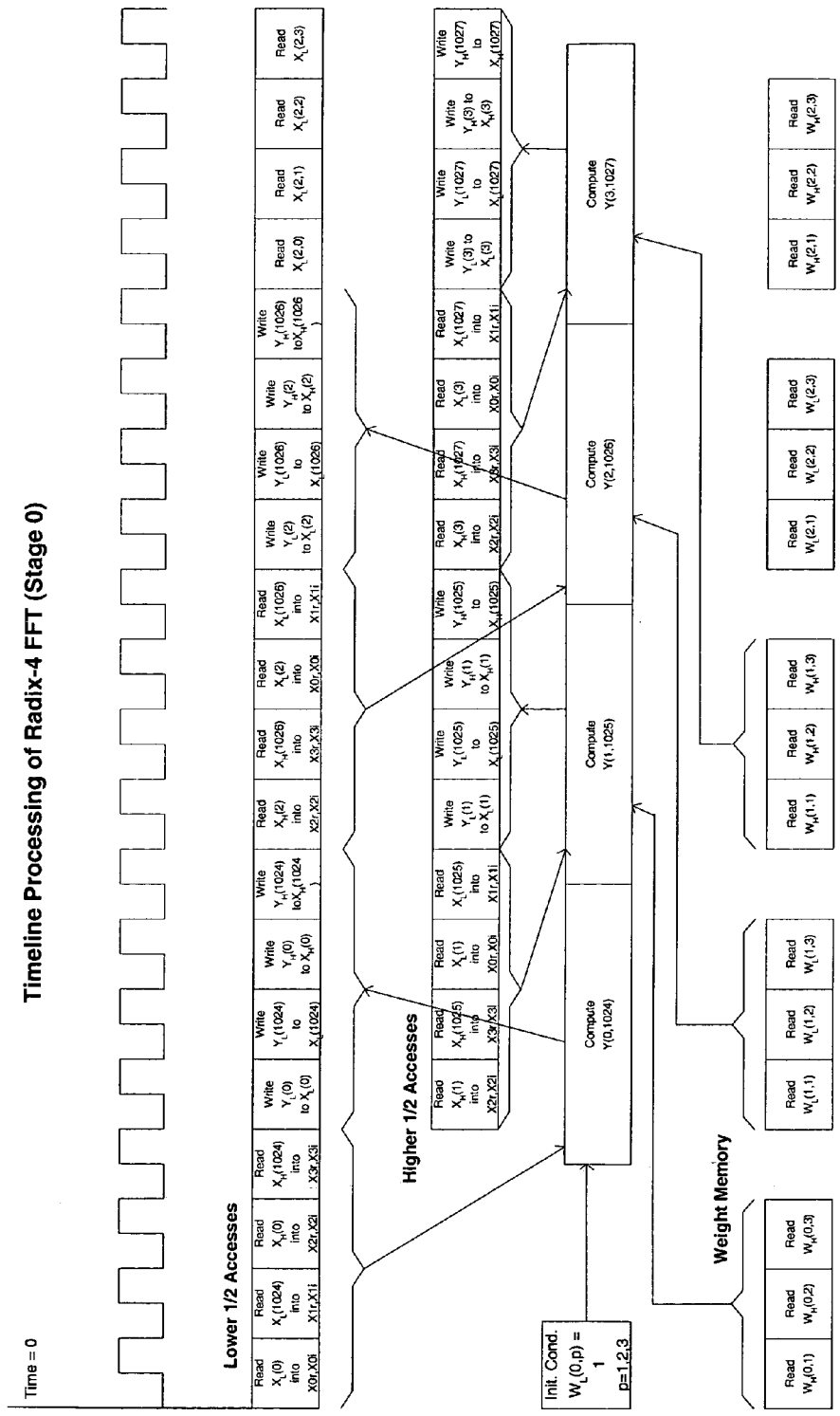
FIG. 8 shows a second timeline for performing a Radix-4 FFT operation in accordance with an embodiment of the present invention.

FIG. 4 shows the ER4 configured for FFT/IFFT operation in accordance with an embodiment of the present invention. The ER4 is generally composed of four sections, namely data fetch/store (DFS), arithmetic unit (AU), configurable controller unit (CCU), and gain controller unit (GCU). The design of the ER4 engine is centered on the throughput of the AU and the access time of the DFS, in order to maximize the ER4 efficiency. The ER4 processes in-place a 4-point butterfly in 4 clock cycles. The DFS requires 4 clock cycles to fetch 4 data points and another 4 cycles to write them back in-place. The transform operation is thus preferably split into two, with each performing on half the memory and time-division-multiplexed onto the AU. An overview of the engine is shown in FIG. 5. It should be noted that the fourth multiplier is included to execute the twiddle operations. The timelines of the FFT operations give insight as to engine's operation, and are shown in FIG. 7 and FIG. 8.

Figure 9:
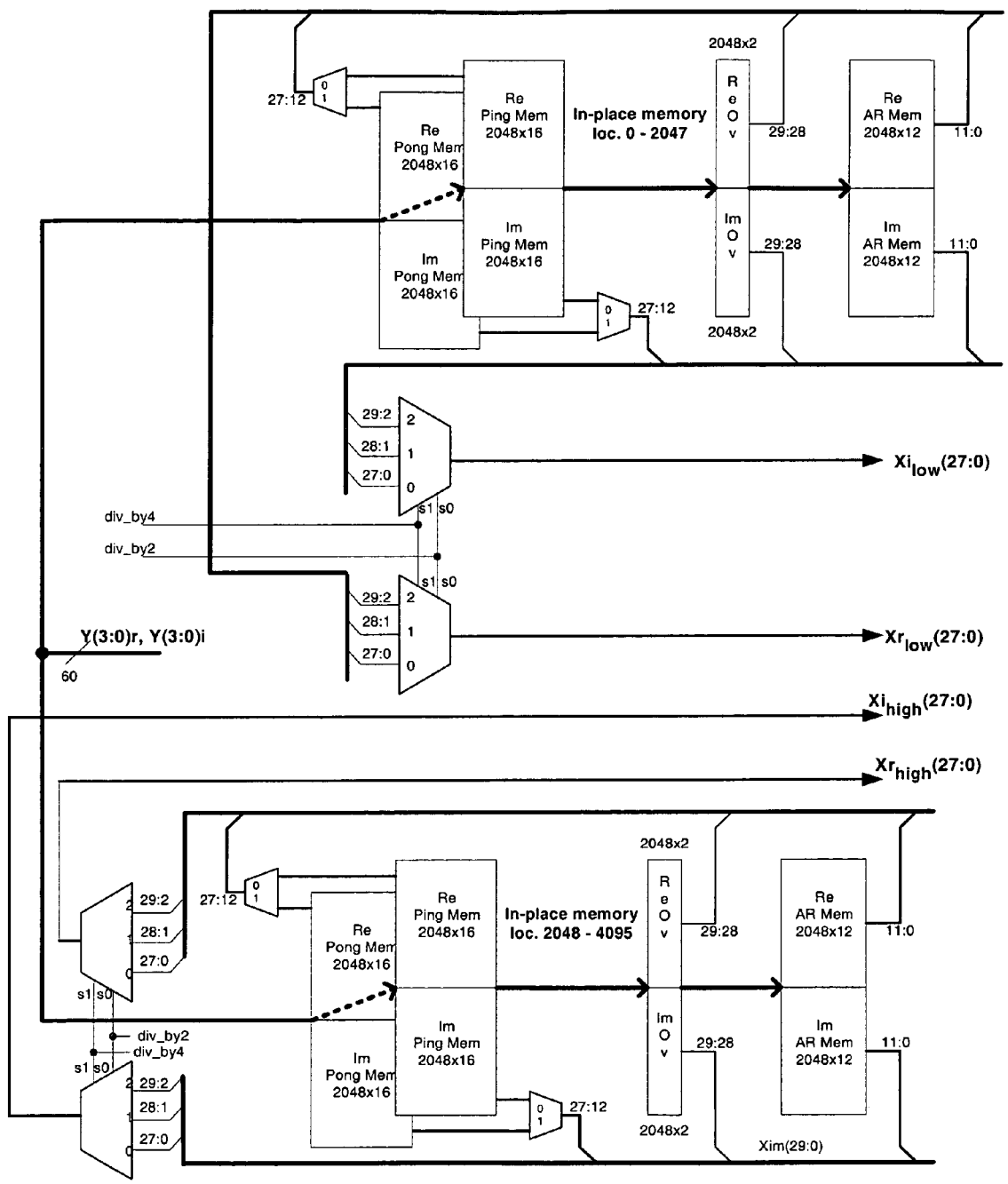
FIG. 9 shows an exemplary data fetch/store (DFS) unit in accordance with an embodiment of the present invention.

The DFS unit, shown in FIG. 9, constantly accesses both data memory halves (referred to as Low and High XMEM) as well the Weights memory (referred to as WMEM). The data memory half access cycle is composed of 4 consecutive reads followed by 4 consecutive writes. DFS alternates accessing both Low and High XMEM memory halves. The Weights section is preferably a lookup table for one quarter of a sine waveform ($\pi/2$ radian), with values for the remaining portion of the sine waveform extrapolated from the quarter sine wave values. The lookup table is typically stored in two portions; each representing one eighth of the sine waveform. This allows for simultaneous access of the sine and cosine of a given angle in a single clock cycle. The angle of p/2 radian is handled separately. This speeding up of memory access is a mirror approach to the memory management of the data memory. The memory management is done this way to ensure that the memory access throughput is matching the data throughput through other parts of the engine. Data memory is preferably organized as two 4096×16 input ping-pong buffers, augmented by a single 4096×14 RAM used to carry arithmetic precision of all in-place calculations. This memory is referred to as In-Place memory, or MEMIN.

Figure 6:
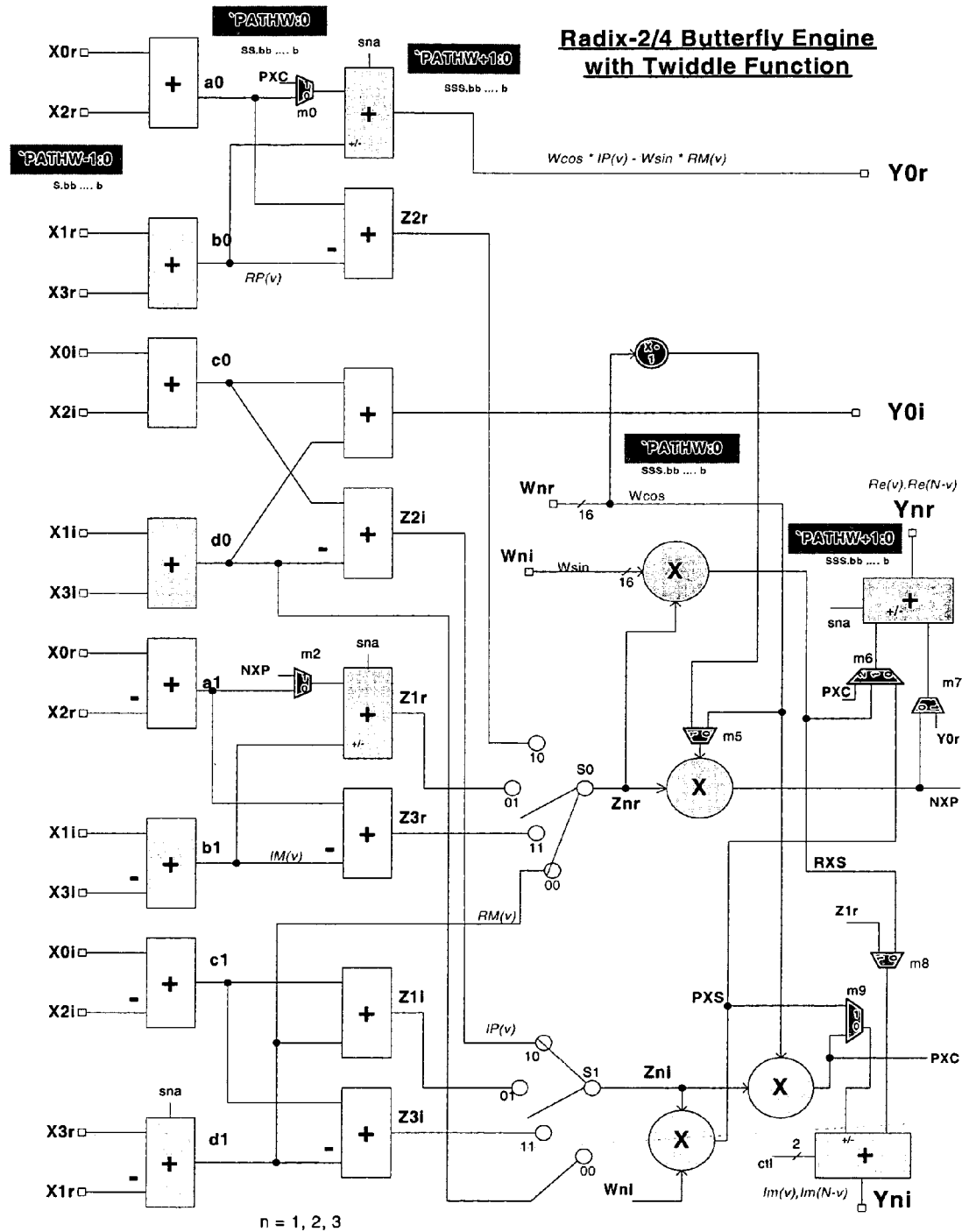
FIG. 6 shows an exemplary engine configuration for performing a Radix-4 butterfly operation in accordance with an embodiment of the present invention.

The AU operates on a set of 4-point inputs and performs the radix-4 butterfly operation, as shown in FIG. 6. Additionally, the AU preferably also performs the twiddle operation. The complex set of 4-point inputs is factored, through a group of adders, to 8 intermediate values that are used to generate the resultant in-place values ($Z_n$ in FIG. 3). Combinations of the intermediate values are sequenced through the final AU stage where the complex multiplications with the Weights are performed. Three multipliers are used to perform the transform operations, and an additional multiplier is used to perform the twiddle operations.

Figure 22:
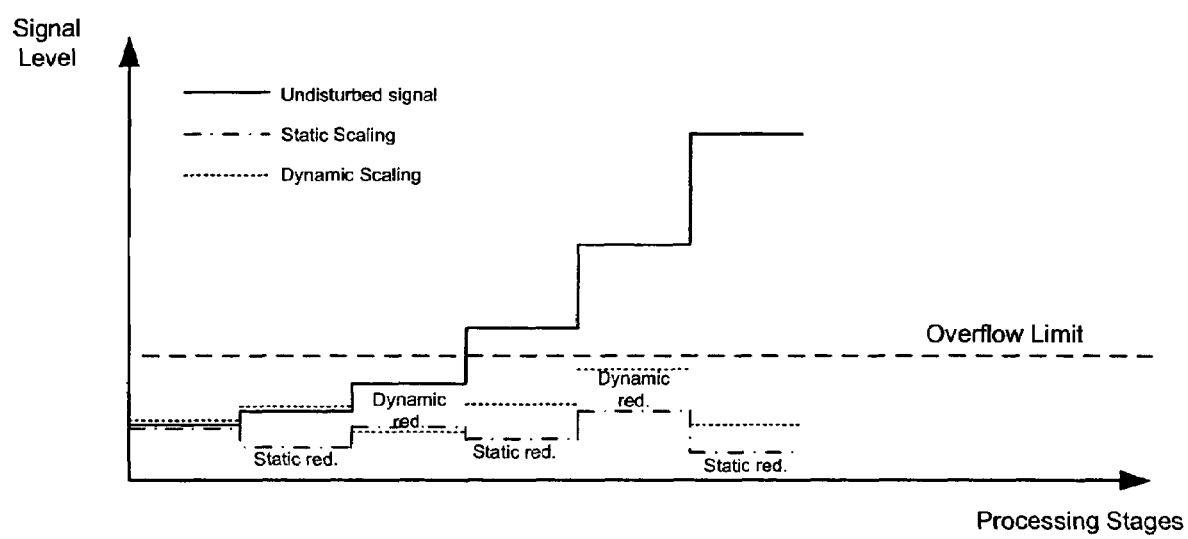
FIG. 22 shows a representation of the improvement provided by dynamic overflow protection (scaling) compared with traditional static scaling in accordance with an embodiment of the present invention.

To allow for high internal precision, static word-length allocation, i.e. adding extra bits to reduce quantization effects and round-off errors, has traditionally been used. In the static allocation technique, in order to prevent overflows, pre-determined numbers of shifts are placed in pre-determined processing stages to reduce signal levels. The pre-determined shifts are assigned based on worst-case analysis of signal levels leading to a loss in processing dynamic range that can only be compensated for by increasing the number of processing bits. Preferred embodiments of the present invention, however, employ dynamic overflow protection, resulting in definite saving in the number of bits needed internally to achieve the same level of quantization reduction. Specifically, signal levels are scaled down only if an overflow is detected in any given stage. Among other things, dynamic overflow protection eliminates unneeded signal reduction in early processing stages and reduces the number of shifts performed. As a result, dynamic overflow protection achieves better quantization error reduction while relaxing the number of processing bits required. FIG. 22 shows a representation of the improvement provided by dynamic overflow protection (scaling) compared with traditional static scaling. The GCU monitors the AU output, as data is written in-place to memory, in order to determine if an overflow condition occurs (as well as the magnitude of the overflow condition). The main outputs of the GCU are div_by2 and div_by4 that are used to scale down the data as it is read out of the memory on the succeeding butterfly operation stage. The FrameClk input resets the GCU logic. Command CLR RSC x1xx xxxx also clears the GCU logic as well as CLR ALL (instructions are described below).

The ER4 includes four address generators (Adgen). Adgen0 is assigned to input memories, Adgen1 to output memories, and Adgen2 to weights/gain-scale memories. Adgen3 is a wild card and can be assigned to any memory in the system. Adgen3 is assigned through the CFG commands (described below). Note that an assignment of Adgen3 to In-Place memory (MEMIN high) via the CFG MEMIN command takes precedence over any assignment via the CFG MEMOUT command.

Table 1 shows data resource addresses for an embodiment of the present invention.

TABLE 1

| | | Data Resource Address | | |
|---|---|---|---|---|
| Resource | Subset | Source Address | Destination Address | Common Src/dest |
| MEMIN | Low | 00010 | 00010 | Y |
| | High | 00011 | 00011 | Y |
| X0 | Low | 00100 | 00100 | Y |
| | High | 00101 | 00101 | Y |
| X1 | Low | 00110 | 00110 | Y |
| | High | 00111 | 00111 | Y |
| X2 | Low | 01000 | 01000 | Y |
| | High | 01001 | 01001 | Y |

TABLE 1-continued

| | | Data Resource Address | | |
|---|---|---|---|---|
| Resource | Subset | Source Address | Destination Address | Common Src/dest |
| X3 | Low | 01010 | 01010 | Y |
| | High | 01011 | 01011 | Y |
| LT1 | | 01100 | — | N |
| LT2 | | 01101 | — | N |
| LT3 | | 01110 | — | N |
| Y0 | | 01111 | — | N |
| Yn | | 00001 | — | N |
| MEMOUT | Low | 11000 | 11000 | Y |
| | High | 11001 | 11001 | Y |
| W1 | Low | — | 10000 | N |
| | High | — | 10011 | N |
| W2 | Low | — | 10001 | N |
| | High | — | 10100 | N |
| W3 | Low | — | 10010 | N |
| | High | — | 10101 | N |

Table 2 shows the ER4 configuration memory map for an embodiment of the present invention.

TABLE 2

| | | Resources address map | |
|---|---|---|---|
| No. | Address | Mnemonic | Description |
| 0 | 0000 0000 | Ad0_stpcnt_L | Adgen0 step count low byte |
| 1 | 0000 0001 | Ad0_stpcnt_H | Adgen0 step count high byte |
| 2 | 0000 0010 | Ad0_Bascnt_L | Adgen0 base count low byte |
| 3 | 0000 0011 | Ad0_Bascnt_H | Adgen0 base count high byte |
| 4 | 0000 0100 | Ad1_stpcnt_L | Adgen1 step count low byte |
| 5 | 0000 0101 | Ad1_stpcnt_H | Adgen1 step count high byte |
| 6 | 0000 0110 | Ad1_Bascnt_L | Adgen1 base count low byte |
| 7 | 0000 0111 | Ad1_Bascnt_H | Adgen1 base count high byte |
| 8 | 0000 1000 | Ad2_stpcnt_L | Adgen2 step count low byte |
| 9 | 0000 1001 | Ad2_stpcnt_H | Adgen2 step count high byte |
| A | 0000 1010 | Ad2_Bascnt_L | Adgen2 base count low byte |
| B | 0000 1011 | Ad2_Bascnt_H | Adgen2 base count high byte |
| C | 0000 1100 | Ad3_stpcnt_L | Adgen3 step count low byte |
| D | 0000 1101 | Ad3_stpcnt_H | Adgen3 step count high byte |
| E | 0000 1110 | Ad3_Bascnt_L | Adgen3 base count low byte |
| F | 0000 1111 | Ad3_Bascnt_H | Adgen3 base count high byte |
| 10 | 0001 0000 | Ds_Ccnt | [7:6] dsh_sel: data source selector into High registers<br>[5:4] dsl_sel: data source selector into Low registers<br>[3:0] ccnt: number of cycles per engine iteration |
| 11 | 0001 0001 | Mem_sel | [7:6] w0sel: selects weights/gain-scale Constants memory<br>[5:4] min_sel: selects input memory<br>[3:2] mout_sel: selects output memory<br>[1:0] mwt_sel: Reserved |
| 12 | 0001 0010 | IterL | [7:0] number of iterations per operation low byte |
| 13 | 0001 0011 | Op_IterH | [7:3] operation instruction<br>[2:0] number of iterations per oeration high bits |
| 14 | 0001 0100 | Ad0_mskl | [7:0] adgen0 mask LSB (maskl[7:0]) |
| 15 | 010101 | Ad0_mskh | [7:0] adgen0 mask MSB (maskh[7:0]> |
| 16 | 0001 0110 | Ad0_mskhl | [7:4] adgen0 maskh[11:8]<br>[3:0] adgen0 maskl[11:8] |
| 17 | 0001 0111 | Adgen_cfg | [7] Cfg_Adg0: adgen0 addresses ½ or full input memory<br>[6] Cfg_Adg1: adgen1 addresses ½ or full output memory<br>[5] Cfg_Adg2: adgen2 addresses ½ or full Constants memory<br>[4:2] Cfg_Adg3: configures Adgen3 to address high input memory or high output memory or high gain-scale memory or high win memory.<br>[1:0] Reserved |
| 18 | 0001 1000 | Adg_sbrv | Adgens' subtract enable and digit-reverse address enable:<br>[3:0] enable digit-reversed output for adgen[3:0], respectively |

TABLE 2-continued

Resources address map

| No. | Address | Mnemonic | Description |
|---|---|---|---|
| 1A | 0001 1010 | Adg_rvse | [7:4] enable subtracting icount from the offset reg. value when the corresponding bit for each adgen is set: [7] adgen3, [6] adgen2, [5] adgen1, [4] adgen0 Adgens' digit-reverse setting: 00 → 10-bit address, 01 → 9-bit address, 10 → 8-bit address, 11 → 7-bit address [7:6] adgen3 adg_rvse setting [5:4] adgen2 adg_rvse setting [3:2] adgen1 adg_rvse setting [1:0] adgen0 adg_rvse setting |
| 1C | 0001 1100 | Ad1_mskl | [7:0] adgen1 mask LSB (maskl[7:0]) |
| 1D | 0001 1101 | Ad1_mskh | [7:0] adgen1 mask MSB (maskh[7:0]) |
| 1E | 0001 1110 | Ad1_mskhl | [7:4] adgen1 maskh[11:8] [3:0] adgen1 maskl[11:8] |
| 1F | 0001 1111 | | |
| 24 | 0010 0100 | Ad2_mskl | [7:0] adgen2 mask LSB (maskl[7:0]) |
| 25 | 0010 0101 | Ad2_mskh | [7:0] adgen2 mask MSB (maskh[7:0])> |
| 26 | 0010 0110 | Ad2_mskhl | [7:4] adgen2 maskh[11:8] [3:0] adgen2 maskl[11:8] |
| 2C | 0010 1100 | Ad3_mskl | [7:0] adgenS mask LSB (maskl[7:0]) |
| 2D | 0010 1101 | Ad3_mskh | [7:0] adgen3 mask MSB (maskh[7:0]) |
| 2E | 0010 1110 | Ad3_mskhl | [7:4] adgen3 maskh[11:8] [3:0] adgen3 maskl[11:8] |
| 2F | 0010 1111 | GC_cfg | [2] CTL select (0 for auto), [1:0] Div_by4, Div_by2 |
| 30 | 0011 0000 | Stb0_sal | Execution start address bits [7:0] for STB0 in IRAM |
| 31 | 0011 0001 | Stb0_sah | Execution start address bits [11:8] for STB0 in IRAM |
| 32 | 0011 0010 | Stb1_sal | Execution start address bits [7:0] for STB1 in IRAM |
| 33 | 0011 0011 | Stb1_sah | Execution start address bits [11:8] for STB1 in IRAM |
| 34 | 0011 0100 | Stb2_sal | Execution start address bits [7:0] for STB2 in IRAM |
| 35 | 0011 0101 | Stb2_sah | Execution start address bits [11:8] for STB2 in IRAM |
| 36 | 0011 0110 | Stb3_sal | Execution start address bits [7:0] for STB3 in IRAM |
| 37 | 0011 0111 | Stb3_sah | Execution start address bits [11:8] for STB3 in IRAM |
| 40 | 0100 0000 | Dif_cfgr | Data Interface configuration register |

The following is the arithmetic used to design the ER4 AU for implementing the Radix-4 butterfly shown in FIG. 3. The in-place computation is performed on real points read, X[3:0], and written back as Y[3:0]. The intermediate set of real points Z[3:0] as well as Y0 are generated conveniently using only add and subtract operations.

$$Y0r = X0r + X1r + X2r + X3r = (X0r + X2r) + (X1r + X3r) \quad (1)$$

$$Y0i = X0i + X1i + X2i + X3i = (X0i + X2i) + (X1i + X3i) \quad (2)$$

The following are the real components of Z[3:0]

$$Z1r = X0r + X1i - X2r - X3i = (X0r - X2r) + (X1i - X3i) \quad (3)$$

$$Z2r = X0r + X2r - X1r - X3r = (X0r + X2r) - (X1i + X2r) \quad (4)$$

$$Z3r = X0r + X3i - X1i - X2r = (X0r - X2r) - (X1i - X3i) \quad (5)$$

The following are the imaginary components of Z[3:0]

$$Z1i = X0i - X1r - X2i + X3r = (X0i - X2i) - (X3r - X1r) \quad (6)$$

$$Z2i = X0i + X2i - X1i - X3i = (X0i + X2i) - (X1i + X3i) \quad (7)$$

$$Z3i = X0i + X1r - X2i - X3r = (X0i - X2i) - (X3r - X1r) \quad (8)$$

The following quantities are defined:

$$A0 = X0r + X2r$$

$$A1 = X0r - X2r$$

$$B0 = X1r + X3r$$

$$B1 = X1i - X3i$$

$$C0 = X0i + X2i$$

$$C1 = X0i - X2i$$

$$D0 = X1i + X3i$$

$$D1 = X3r - X1r$$

Thus, equations (1) through (8) can be re-written as follows:

$$Y0r = A0 + B0$$

$$Y0i = C0 + D0$$

$$Z1r = A1 + B1$$

$$Z1i = C1 + D1$$

$$Z2r = A0 - B0$$

$$Z2i = C0 - D0$$

$$Z3r = A1 - B1$$

$$Z3i = C1 - D1$$

It should be noted that each addition and subtraction term is used twice. The final operation of the AU is a complex multiplication of the Z terms with appropriate weights:

$$Y1 = Z1 * W^k$$

$$Y2 = Z2 * W^{2k}$$

$$Y3 = Z3 * W^{3k}$$

The complex multiplication has the form:

$$Y_n(k) = [Z_{nr}(k) + jZ_{ni}(k)] * [\cos(2\pi nk/N) - j\sin(2\pi nk/N)], \quad (9)$$

where n is $\in [1,2,3]$ as in equations (3) through (8) above. Four multiplies and two adds are required to produce the final result, as shown in equation (9). Four clock cycles are necessary to generate each Ynr and Yni. Z1, Z2 and Z3 are time-multiplexed into the complex multiply plus a forth cycle to generate Y0, which requires no multiply operation.

Table 3 shows a program example to implement the FFT function in accordance with an embodiment of the present invention. The purpose of this example is to demonstrate the type of assembly instructions required to program the engine and uses a readable mnemonic format which is not the actual instruction set. Instructions are described below. It should be noted that there are two categories of instructions, namely instructions to set up and configure the engine and instructions for data movement.

//*** Constants declaration ****//

N=1024

//*** Configuration and setup section ***//

START_EXEC:

TABLE 3

| Sample FFT Program | | | | |
|---|---|---|---|---|
| Cfg | FFT | | $ | //*** this command also sets up ADG3, input and output memories, here we accept the default settings. */ |
| Cfg | STB | frmclk | $ | //** start exec. When frame clock pulse arrives. */ |
| Clr | ALL | | $ | //*** reset all address generators and data reg.s |
| Cfg | ADG0_offset | N | $ | //*** each FFT iteration we read loc's i and i + N from both high and low memories (MH and ML) */ |
| Mov | MH(i) | X2L | $ | //*** move MH(0) -> X2 ,content of loc. 0 |
| Mov | MH(i++) | X3L | $ | //*** move MH(1024) -> X3 .content of loc. 1024 */ |
| Mov | ML(i) | X0L | $ | //*** move ML(0) -> X0 ,content of loc. 0 |
| Mov | ML(i++) | X1L | $ | //*** move ML(1024) -> X1 .content of loc. 1024 */ |
| Tog | | | | Toggle mux input to AU |
| Rep | 1024 | ( | | //*** loop setup stage 0 |
| Mov | MH(i + 1) | X2H | | |
| Mov | LT1(k) | W1H | | //*** fetch $W^k$ and store in W1H reg. |
| Mov | Y0 | ML(i) | $ | |
| Mov | MH(i ++ 1) | X3H | | |
| Mov | LT2(k) | W2H | | //*** fetch $W^{2k}$ and store in W2H reg. |
| Mov | Yn | ML(i++) | $ | |
| Mov | ML(i + 1) | X0H | | |
| Mov | LT3(k) | W3H | | //*** fetch $W^{3k}$ and store in W3H reg. |
| Mov | Yn | MH(i) | $ | |
| Mov | ML(i ++ 1) | X1H | | |
| Mov | Yn | MH(i++̂) | $ | |
| Tog | | | | //*** Toggle mux input to AU |
| Mov | MH(i) | X2L | | //*** move MH(1) -> X2 ,content of loc. 0 |
| Mov | LT1(k) | W1L | | //*** fetch $W^k$ and store in W1L reg. |
| Mov | Y0 | ML(i) | $ | |
| Mov | MH(i++) | X3L | | |
| Mov | LT2(k) | W2L | | //*** fetch $W^k$ and store in W2L reg. |
| Mov | Yn | ML(i) | $ | |
| Mov | ML(i) | X0L | | |
| Mov | LT3(k) | W3L | | //*** fetch $W^k$ and store in W3L reg. |
| Mov | Yn | MH(i) | $ | |
| Mov | ML(i++) | X1L | | |
| Mov | Yn | MH(i++) | $ | |
| Tog | | | | //*** Toggle mux input to AU |
| | ) | | | |
| | | | | //*** stages 1–5 |
| Clr | ALL | | $ | //*** clear all counters and registers |
| Cfg | ADG0_offset | N/4 | $ | //** offset = 256 |
| Mov | ML(i) | X0L | $ | |
| Mov | ML(i++) | X1L | $ | |
| Mov | ML(j++) | X2L | $ | |
| Mov | ML(j++) | X3L | $ | |
| Rep | 5 | ( | | |
| Rep | 256 | ( | | |
| Mov | Y0 | ML(i) | | //*** Write Y0 in-place |
| Mov | LT1(k) | W1H | | //*** fetch $W^k$ and store in W1H reg. |
| Mov | MH(i) | X0H | $ | |
| Mov | Yn | ML(i++) | | //*** write Y1 in-place |
| Mov | LT2(k) | W2H | | //*** fetch $W^{2k}$ and store in W2H reg. |
| Mov | ML(i++̂) | X1H | $ | |
| Mov | Yn | ML(j++) | | //*** write Y2 in-place |

TABLE 3-continued

Sample FFT Program

| | | | |
|---|---|---|---|
| Mov | LT3(k) | W2H | //*** fetch $W^{3k}$ and store in W3H reg. |
| Mov | ML(j++) | X2H | $ |
| Mov | Yn | ML(j++) | //*** write Y3 in-place |
| Mov | ML(j++) | X3H | |
| Tog | | $ | //*** toggle input mux to AU from Xn1 to XnH. */ |
| Mov | Y0 | MH(i) | |
| Mov | LT1(k) | W1H | //*** fetch $W^k$ and store in W1H reg. |
| Mov | MH(i) | X0L | $ |
| Mov | Yn | MH(i++) | |
| Mov | ML(i++) | X1L | $ |
| Mov | LT2(k) | W2L | //*** fetch $W^{2K}$ and store in W2H reg. |
| Mov | Yn | MH(j++) | |
| Mov | LT3(k) | W2L | //*** fetch $W^{3k}$ and store in W3H reg. |
| Mov | ML(j++) | X2L | $ |
| Mov | Yn | MH(j++) | |
| Mov | ML(j++) | X3L | $ |
| | | )) | | where i=the current value of $i_{counter}$ in a given ADG, j=the current value of $j_{counter}$ in a given ADG, ++=output is the sum of the specified counter and the offset register in a given ADG, ^=increment the specified counter at the next clock cycle, and ML, MH=configured input memories.

The following is sample working ER4 assembler code for performing a 4096 point FFT in accordance with an embodiment of the present invention:

```
2618    // OPR STB0    ****** code for 4096 pt FFT ****
0000    // NOP ;
226C    // CFG MEMIN ;XMEM_h_addr=adg3,XMEM_h=MEMIN_h,XMEM_low=MEMIN_l
0000    // NOP;
2000    // CLR ALL
0000    // NOP;
0000    // NOP;%%%%%%%%%%%%%%%%   1st STAGE   %%%%%%%%%%%%%%%%%%%%%%
2611    // OPR FFT
211F    // CLR RSC; clr cntrs & init. wts regs to .999
0000    // NOP;
0C00    // MOV 0,IA      ; indirect-wr addr
0D00    // MOV 0,[IA]    ; indirect-wr
0C01    // MOV 1,IA      ; indirect-wr addr
0D04    // MOV 4,[IA]    ; indirect-wr /\/\/\/\ MOV 0x400,adg0_offset /\/\/\
0C0C    // MOV C,IA      ; indirect-wr addr
0D00    // MOV 0,[IA]    ; indirect-wr
0C0D    // MOV D,IA      ; indirect-wr addr
0D04    // MOV 4,[IA]    ; indirect-wr /\/\/\/\ MOV 0x400,adg3_offset /\/\/\
0001    // SKIP
2521    // RCMD 12 ; start_bfly, zero-out scratch-pad memory
261F    // SET STAGECLK ;
0000    // NOP ;
440A    //\___long MOV - m1
0080    // /
540B    //\___long MOV - m2
0080    // /
4040    //\___long MOV - m3
0080    // /
4141    //\___long MOV - m4
0A98    // /
4200    // -|___loop CONFIG LP0 (512 times)
2001    // -|
4C4E    //\___long MOV - m5
0394    // /
7D4F    //\___long MOV - m6
0395    // /
64D4    //\___long MOV - m7
039E    // /
77F5    //\___long MOV - m8
0980    // /
4C4A    //\___long MOV - m9
0391    // /
7D4B    //\___long MOV - m10
0392    // /
64D0    //\___long MOV - m11
```

-continued

```
039B    // /
77F1    // \___long MOV (Eval.) - m12
0D80    // /
261F    // SET STAGECLK ;
0000    // NOP ;
0000    // NOP %%%%%%%%%%%%%   2nd STAGE   %%%%%%%%%%%%%%%%%%%%
0000    // NOP *** we use 2 nested loops
2500    // RCMD 0; remove zero-out scratch-pad memory
0C00    // MOV 0,IA          ; indirect-wr addr
0D00    // MOV 0,[IA]        ; indirect-wr
0C01    // MOV 1,IA          ; indirect-wr addr
0D01    // MOV 1,[IA]        ; indirect-wr /\/\/\/\ MOV 0x100,adg0__offset /\/\/\
0C0C    // MOV C,IA          ; indirect-wr addr
0D00    // MOV 0,[IA]        ; indirect-wr
0C0D    // MOV D,IA          ; indirect-wr addr
0D01    // MOV 1,[IA]        ; indirect-wr /\/\/\/\ MOV 0x100,adg3__offset /\/\/\
0C08    // MOV 8,IA          ; indirect-wr addr     |######################|
0D04    // MOV 4,[IA]        ; indirect-wr          |### Wts cntr offset ####|
0C09    // MOV 9,IA          ; indirect-wr addr     |######################|
0D00    // MOV 0,[IA]        ; indirect-wr /\/\/\/\ MOV 0x004,adg2__offset /\/\/\
0000    // NOP;
211F    // CLR RSC; clr cntrs & init. wts regs to .999
0000    // NOP
4002    // -|###loop CONFIG LP1 (2-times) ########
2002    // -|
4040    // \___long MOV - m1 :> Mov ML(i),    X0L;
0080    // /
4141    // \___long MOV - m2 :> Mov ML(i++), X1L;
0080    // /
4102    // \___long MOV - m3 :> Mov ML(j++), X2L;
0080    // /
4103    // \___long MOV - m4 :> Mov ML(j++), X3L;
0880    // /
4100    // -|___loop CONFIG LP0 (256 times)
2001    // -|
444C    // \___long MOV - m5
0384    // /
754D    // \___long MOV - m6
0385    // /
710E    // \___long MOV - m7
0386    // /
712F    // \___long MOV - m8
0980    // /
4450    // \___long MOV - m9
03C1    // /
7551    // \___long MOV - m10
0382    // /
7112    // \___long MOV - m11
0383    // /
7313    // \___long MOV (Eval.) - m12
0D80    // /
0000    // NOP
213F    // CLR RSC; clr cntrs & init. wts regs to .999
0000    // NOP
0000    // NOP
0C02    // MOV 2,IA          ; indirect-wr addr     |######################|
0D00    // MOV 0,[IA]        ; indirect-wr          |### Xcntr Base__count####|
0C03    // MOV 3,IA          ; indirect-wr addr     |######################|
0D04    // MOV 4,[IA]        ; indirect-wr /\/\/\/\ MOV 0x400,adg0 bas__cnt /\/\/\
0C0F    // MOV F,IA          ; indirect-wr addr     |### Ycntr Base__count####|
0D04    // MOV 4,[IA]        ; indirect-wr /\/\/\/\ MOV 0x400,adg3 bas__cnt /\/\/\
2400    // --- toggle imux only
0000    // NOP
26F2    // LpEnd1;
0001    // SKIP
261F    // SET STAGECLK ;
0000    // NOP ;
0000    // NOP; %%%%%%%%%%%%%   3rd STAGE   %%%%%%%%%%%%%%%%%%%%
0000    // NOP
0000    // NOP *** we use 2 nested loops
0C08    // MOV 8,IA          ; indirect-wr addr     |######################|
0D10    // MOV 10,[IA]       ; indirect-wr          |### Wts cntr offset ####|
0C09    // MOV 9,IA          ; indirect-wr addr     |######################|
0D00    // MOV 0,[IA]        ; indirect-wr /\/\/\/\ MOV 0x010,adg2__offset /\/\/\
0C00    // MOV 0,IA          ; indirect-wr addr
0D40    // MOV 40,[IA]       ; indirect-wr
0C01    // MOV 1,IA          ; indirect-wr addr
0D00    // MOV 0,[IA]        ; indirect-wr /\/\/\/\ MOV 0x040,adg0__offset /\/\/\
0C0C    // MOV C,IA          ; indirect-wr addr
0D40    // MOV 40,[IA]       ; indirect-wr
```

-continued

```
0C0D    // MOV D,IA         ; indirect-wr addr
0D00    // MOV 0,[IA]       ; indirect-wr /\/\/\/\  MOV 0x040,adg3_offset /\/\/\
0C03    // MOV 3,IA ;
0D00    // MOV 0,[IA]       ; CLR high byte of adgen0 base_count /\/\/\
0C0F    // MOV F,IA ;
0D00    // MOV 0,[IA]       ; CLR high byte of adgen3 base_count /\/\/\
211F    // CLR RSC; clr cntrs & init. wts regs to .999
0000    // NOP
0000    // NOP
4008    // -|   ###   Loop config LP 1 (8 times)      ###
2002    // -|
4040    // \____long MOV - m1 :> Mov ML(i),    X0L;
0080    // /
4141    // \____long MOV - m2 :> Mov ML(i++), X1L;
0080    // /
4102    // \____long MOV - m3 :> Mov ML(j++), X2L;
0080    // /
4103    // \____long MOV - m4 :> Mov ML(j++), X3L;
0880    // /
4040    // -|___loop CONFIG LP0 (64 times)
2001    // -|
444C    // \____long MOV - m5
0384    // /
754D    // \____long MOV - m6
0385    // /
710E    // \____long MOV - m7
0386    // /
712F    // \____long MOV - m8
0980    // /
4450    // \____long MOV - m9
03C1    // /
7551    // \____long MOV - m10
0382    // /
7112    // \____long MOV - m11
0383    // /
7313    // \____long MOV (Eval.) - m12
0D80    // /
0000    // NOP
213F    // CLR RSC; clr cntrs & init. wts regs to .999
0000    // NOP
2D80    // AAO 5,100 ; Add 100 to adgen0 and adgen3 base_count(80h x2)
2400    // --- toggle imux only
0000    // NOP
26F2    // LpEnd1;
0001    // SKIP
261F    // SET STAGECLK ;
0000    // NOP ;
0000    // NOP; %%%%%%%%%%%%%%%   4th STAGE    %%%%%%%%%%%%%%%%%%%%%
0000    // NOP
0000    // NOP *** we use 2 nested loops
0C08    // MOV 8,IA         ; indirect-wr addr   |#####################|
0D40    // MOV 40,[IA]      ; indirect-wr         |### Wts cntr offset ####|
0C09    // MOV 9,IA         ; indirect-wr addr   |#####################|
0D00    // MOV 0,[IA]       ; indirect-wr /\/\/\/\  MOV 0x040,adg2_offset /\/\/\
0C00    // MOV 0,IA         ; indirect-wr addr
0D10    // MOV 10,[IA]      ; indirect-wr
0C01    // MOV 1,IA         ; indirect-wr addr
0D00    // MOV 0,[IA]       ; indirect-wr /\/\/\/\  MOV 0x010,adg0_offset /\/\/\
0C0C    // MOV C,IA         ; indirect-wr addr
0D10    // MOV 10,[IA]      ; indirect-wr
0C0D    // MOV D,IA         ; indirect-wr addr
0D00    // MOV 0,[IA]       ; indirect-wr /\/\/\/\  MOV 0x010,adg3_offset /\/\/\
0C02    // MOV 2,IA ;
0D00    // MOV 0,[IA]       ; CLR low byte of adgen0 base_count /\/\/\
0C03    // MOV 3,IA ;
0D00    // MOV 0,[IA]       ; CLR high byte of adgen0 base_count /\/\/\
0C0E    // MOV E,IA ;
0D00    // MOV 0,[IA]       ; CLR low byte of adgen3 base_count /\/\/\
0C0F    // MOV F,IA ;
0D00    // MOV 0,[IA]       ; CLR high byte of adgen3 base_count /\/\/\
211F    // CLR RSC; clr cntrs & init. wts regs to .999
0000    // NOP
0000    // NOP
4020    // -|   ###   Loop config LP 1 (32 times)     ###
2002    // -|
4040    // \____long MOV - m1 :> Mov ML(i),    X0L;
0080    // /
4141    // \____long MOV - m2 :> Mov ML(i++), X1L;
0080    // /
4102    // \____long MOV - m3 :> Mov ML(j++), X2L;
```

-continued

```
0080    // /
4103    // \___long MOV - m4 :> Mov ML(j++), X3L;
0880    // /
4010    // -|___loop CONFIG LP0 (16 times)
2001    // -|
444C    // \___long MOV - m5
0384    // /
754D    // \___long MOV - m6
0385    // /
710E    // \___long MOV - m7
0386    // /
712F    // \___long MOV - m8
0980    // /
4450    // \___long MOV - m9
03C1    // /
7551    // \___long MOV - m10
0382    // /
7112    // \___long MOV - m11
0383    // /
7313    // \___long MOV (Eval.) - m12
0D80    // /
0000    // NOP
213F    // CLR RSC; clr cntrs & init. wts regs to .999
0000    // NOP
2D20    // AAO 5,40 ; Add 40 to adgen0 and adgen3 base_count (20h x2)
2400    // --- toggle imux only
0000    // NOP
26F2    // LpEnd1;
0001    // SKIP
261F    // SET STAGECLK ;
0000    // NOP ;
0000    // NOP; %%%%%%%%%%%%%%%   5th STAGE   %%%%%%%%%%%%%%%%%%%%%%
0000    // NOP
0000    // NOP *** we use 2 nested loops
0C08    // MOV 8,IA       ; indirect-wr addr    |#####################|
0D00    // MOV 00,[IA]    ; indirect-wr         |### Wts cntr offset ####|
0C09    // MOV 9,IA       ; indirect-wr addr    |#####################|
0D01    // MOV 1,[IA]     ; indirect-wr /\/\/\/ MOV 0x100,adg2_offset /\/\/\
0C00    // MOV 0,IA       ; indirect-wr addr
0D04    // MOV 4,[IA]     ; indirect-wr
0C01    // MOV 1,IA       ; indirect-wr addr
0D00    // MOV 0,[IA]     ; indirect-wr /\/\/\/ MOV 0x004,adg0_offset /\/\/\
0C0C    // MOV C,IA       ; indirect-wr addr
0D04    // MOV 4,[IA]     ; indirect-wr
0C0D    // MOV D,IA       ; indirect-wr addr
0D00    // MOV 0,[IA]     ; indirect-wr /\/\/\/ MOV 0x004,adg3_offset /\/\/\
0C02    // MOV 2,IA ;
0D00    // MOV 0,[IA]     ; CLR low byte of adgen0 base_count /\/\/\
0C03    // MOV 3,IA ;
0D00    // MOV 0,[IA]     ; CLR high byte of adgen0 base_count /\/\/\
0C0E    // MOV E,IA ;
0D00    // MOV 0,[IA]     ; CLR low byte of adgen3 base_count /\/\/\
0C0F    // MOV F,IA ;
0D00    // MOV 0,[IA]     ; CLR high byte of adgen3 base_count /\/\/\
211F    // CLR RSC; clr cntrs & init. wts regs to .999
0000    // NOP
0000    // NOP
4080    // -| ###   Loop config LP 1 (128 times)    ###
2002    // -|
4040    // \___long MOV - m1 :> Mov ML(i),    X0L;
0080    // /
4141    // \___long MOV - m2 :> Mov ML(i++), X1L;
0080    // /
4102    // \___long MOV - m3 :> Mov ML(j++), X2L;
0080    // /
4103    // \___long MOV - m4 :> Mov ML(j++), X3L;
0880    // /
4004    // -|___loop CONFIG LP0 (4 times)
2001    // -|
444C    // \___long MOV - m5
0384    // /
754D    // \___long MOV - m6
0385    // /
710E    // \___long MOV - m7
0386    // /
712F    // \___long MOV - m8
0980    // /
4450    // \___long MOV - m9
03C1    // /
7551    // \___long MOV - m10
```

-continued

```
0382     // /
7112     // \___long MOV - m11
0383     // /
7313     // \___long MOV (Eval.) - m12
0D80     // /
0000     // NOP
213F     // CLR RSC; clr cntrs & init. wts regs to .999
0000     // NOP
2D08     // AAO 5,08 ; Add 10 to adgen0 and adgen3 base_count (08h x2)
2400     // --- toggle imux only
0000     // NOP
26F2     // LpEnd1;
0001     // SKIP
261F     // SET STAGECLK ;
0000     // NOP ;
0000     // NOP; %%%%%%%%%%%%%%%  6th STAGE   %%%%%%%%%%%%%%%%%%%%%%
0000     // NOP
0000     // NOP *** we use 2 nested loops
0C08     // MOV 8,IA      ; indirect-wr addr    |#####################|
0D00     // MOV 00,[IA]   ; indirect-wr         |### Wts cntr offset ####|
0C09     // MOV 9,IA      ; indirect-wr addr    |#####################|
0D00     // MOV 0,[IA]    ; indirect-wr /\/\/\/ MOV 0x00,adg2_offset /\/\/\
0C00     // MOV 0,IA      ; indirect-wr addr
0D04     // MOV 4,[IA]    ; indirect-wr
0C01     // MOV 0,IA      ; indirect-wr addr
0D00     // MOV 0,[IA]    ; indirect-wr /\/\/\/ MOV 0x004,adg0_offset /\/\/\
0C0C     // MOV C,IA      ; indirect-wr addr
0D04     // MOV 4,[IA]    ; indirect-wr
0C0D     // MOV D,IA      ; indirect-wr addr
0D00     // MOV 0,[IA]    ; indirect-wr /\/\/\/ MOV 0x004,adg3_offset /\/\/\
0C02     // MOV 2,IA ;
0D00     // MOV 0,[IA]    ; CLR low byte of adgen0 base_count /\/\/\
0C03     // MOV 3,IA ;
0D00     // MOV 0, [IA]   ; CLR high byte of adgen0 base_count /\/\/\
0C0E     // MOV E,IA ;
0D00     // MOV 0, [IA]   ; CLR low byte of adgen3 base_count /\/\/\
0C0F     // MOV F, IA ;
0D00     // MOV 0, [IA]   ; CLR high byte of adgen3 base_count /\/\/\
211F     // CLR RSC; clr cntrs & init. wts regs to .999
0000     // NOP
0000     // NOP
//4200   // -|   ###   Loop config LP 1 (200 times)    ###
//2002   // -|
4040     // \___long MOV - m1 :> Mov ML(i),    X0L;
0080     // /
40C1     // \___long MOV - m2 :> Mov ML(i+1), X1L;
0080     // /
4082     // \___long MOV - m3 :> Mov ML(j+1), X2L;
0080     // /
4083     // \___long MOV - m4 :> Mov ML(j+1), X3L;
0880     // /
4200     // -|___loop CONFIG LP0 (200 times)
2001     // -|
444C     // \___long MOV - m5
0384     // /
6CCD     // \___long MOV - m6
0385     // /
688E     // \___long MOV - m7
0386     // /
68AF     // \___long MOV - m8
1980     // /
4450     // \___long MOV - m9
03C1     // /
6CD1     // \___long MOV - m10
0382     // /
6892     // \___long MOV - m11
0383     // /
6A93     // \___long MOV (Eval.) - m12
1D80     // /
//2D02   // AAO 5,02 ; Add 4 to adgen0 and adgen3 base_count (02h x2)
//0000   // NOP
//26F2   // LpEnd1;
//0001   // SKIP
04FF     // GOTO 0xFF;
0000     // NOP
```

Table 4 shows and describes the instruction set for an exemplary embodiment of the present invention. Operational code (Opcode) is designed with multi-stage decoding. Standard instructions are 16-wide. Four instruction categories exist, encoded by Opcode <A>, as follows:

00: configuration, setup and administration
01: Multi-function extended (32-bit) instructions
10: Immediate Move operations
11: Reserved for expansion The multi-tiered decoding is, in descending order, Op code<A>..Op code<D>.

TABLE 4

Instruction Set

| Op code <A> | Op code <B> | Op code <C> | Op code <D> | Mnemonic | Description |
|---|---|---|---|---|---|
| 00 | 00 | 00 | xx xxxx xxx0 | NOP | No operation is executed. |
|  |  | 00 | xx xxxx xxx1 | SKIP | Valid in odd addresses only, causes execution of even-addr. Instruction only. PC increments on next clock |
|  |  | 10 | N[9:0] | JMP N | Fetch next instruction at address = current address + N, where N is 2's complement |
|  |  | 01 | N[9:0] | Goto N | Jump to address N in IRAM |
|  |  | 11 | {00,N[7:0]} | Movi N, IA | Move N to indirect address (IA) reg. |
|  |  | 11 | {01,N[7:0]} | Movi N, [IA] | Move N to dest. Specified by IA |
|  | 01 |  | X |  | Reserved |
|  | 10 | 000 | 0 xxxx xxxx | CLR ALL | Reset all datapath resources (counters, reg.'s ... etc.) |
|  |  |  | {1, RSC[7:0]} | CLR RSC | Reset a specific resource RSC |
|  |  | 001 | {001, N[5:0]} | CFG Memin N | Configure Resource N as input memory to AU |
|  |  |  | {010, N[5:0]} | CFG Memout N | Configure Resource N as output memory to AU |
|  |  |  | {011, N[5:0]} | CFG Mwt N | Configure Resource N as input Weights/Constants memory to AU |
|  |  |  | {100, N[5:0]} | CFG Mem_Dest N | Configure Resource N as destination for input memory (used in multi-operation instructions)[efficient to select X-reg's] NOT IMPLEMENTED |
|  |  |  | {101,N[5:0]} | WR FLG | Write output flags register FLG as follows: FLG5 <= N[5] ... FLG0 <= N[0] |
|  |  |  | {110,N[5:0]} | CFG CONN | Configure specialized connections: [0] connects Memin High to Memin Low [5:1]TBD |
|  |  | 010 | 0 0000 0000 | Tog | Toggle mux input to AU |
|  |  |  | {1, N[7:0]} | RCMD | Registered command, described in Table 5 |
|  |  | 011 | 0 0000 0000 | STOP | Stop execution, halts pc at current value |
|  |  |  | 0 0000 0001 | GO | Start immediate execution |
|  |  |  | 0 1111 0001 | Loop_end0 | Specifies the end of Loop 0 |
|  |  |  | 0 1111 0010 | Loop_end1 | Specifies the end of Loop 1 |
|  |  |  | 0 1111 0100 | Loop_end2 | Specifies the end of Loop 2 |
|  |  |  | 0 1111 1000 | Loop_end3 | Specifies the end of Loop 3 |
|  |  |  | 0 0111 0001 |  | Reserved |
|  |  |  | 0 0111 0010 |  | Reserved |
|  |  |  | 0 0111 0100 |  | Reserved |
|  |  |  | 0 0111 1000 |  | Reserved |
|  |  |  | 0 0001 0001 | OPR FFT | function of AU = FFT Radix-4 |
|  |  |  | 0 0001 0010 | OPR PRTW | function of AU = Pre-Twiddle |
|  |  |  | 0 0001 0011 | OPR IFFT | function of AU = DFFT |
|  |  |  | 0 0001 0100 | OPR GSC | function of AU = gain-scale multiplication |
|  |  |  | 0 0001 0101 | OPR BRLS | function of AU = Barrel Shift the Output |
|  |  |  | 0 0001 0110 | OPR PSTW | function of AU = Post- Twiddle |
|  |  |  | 0 0001 0111 | OPR FFT2 | function of AU = FFT Radix-2 |
|  |  |  | 0 0001 1000 | OPR STB0 | Enable STB0 as start of execution trigger |
|  |  |  | 0 0001 1001 | OPR STB1 | Enable STB1 as start of execution trigger |
|  |  |  | 0 0001 1010 | OPR STB2 | Enable STB2 as start of execution trigger |

TABLE 4-continued

Instruction Set

| Op code <A> | Op code <B> | Op code <C> | Op code <D> | Mnemonic | Description |
|---|---|---|---|---|---|
| | | | 0 0001 1111 | OPR STB3 | Enable STB3 as start of execution trigger |
| | | | 0 0001 1011 | ALLSTB OFF | Disables all STB |
| | | | 0 0001 1100 | ALLSTB ON | Enable all STB |
| | | | 0 0001 1110 | SET STAGECLK | Assert the stageclk signal |
| | | 1,adg [2:0] | N[7:0] | AAO N | Selected Adgen, by adg[2:0], accumulate address base count is written with value N |
| | 11 | | | Reserved | |
| 10 | [13:10] Addr | [9:8] Byte position | [7:0] data | MOVI RSC.n data | Move immediate 8-bit data to resource (RSC) at byte position specified by n. RSC is limited to X0...X3 registers. For n = 0 –> D[7:0], n = 1 –> D[15:8], n = 2 –> D[23:16], n = 3 –> D[31:24] |
| 01 | Double-Word (32-bit) multiple-function instructions are described below in Table 6 | | | | |
| 11 | | | | Reserved | |

CFG MEMIN Command

Six bits define the input memory configuration as follows:

5: Address counter selector for XMEM high; 0→adgen0, 1→adgen3.[1]

[1] Adgen3 can also be configured with CFG MEMOUT. However, this instruction takes precedence.

4-3: Data source selector for XMEM high (the memory that drives the X-registers.) [dsh_sel(2:0)]

2: Use Ymem CTR settings (bits 12-9) of the multi-move single instruction to control adgen3 when 1.

1-0: Data source selector for XMEM low (the memory that drives the X-registers.) [dsl_sel(2:0)]

The data source selectors, for both high and low XMEM, decode as follows:
   00→In Place memory (MEMIN) Low
   01→In Place memory (MEMIN) High
   10→In Place memory–Optional Channel (usually is the same as MEMIN low)
   11→TBD CFG MEMOUT Command Six bits select the memory destination (YMEM) of AU's Y-outputs as well as the address generator for the YMEM high portion.

5-4: select the address generator for low YMEM as follows: [ymadr_sel]
   00→adgen1 (default, also drives high YMEM)
   01→adgen3
   10→adgen2
   11→adgen0

3-2: select the address generator for high YMEM as follows: [ymadr_sel]
   00→adgen1 (default, also drives low YMEM)
   01→adgen3
   10→adgen2
   11→adgen0

1-0: select YMEM data destination [ymm_sel(2:0)]

The data destinations for YMEM decode as follows:
   00→MEMIN
   01→MEMOUT
   10→MEM-PFP
   11→Misc. (TBD)

CFG Mwt Command

Six bits are assigned to this command [5:0] but only [3:0] are used as follows:

1-0: Select data source for constants (w0sel)
   0→Sine lookup table
   1→Gain Scale memory
   2→Windowing memory
   3→auxiliary memory 3-2: adgen select for data source
   0→adgen2
   1→adgen1
   2→adgen0
   3→adgen3

CLR RSC Command

Bits 7:0 individually reset and initialize engine resources as follows:

0: adgen0

1: adgen1

2: adgen2

3: adgen3

4: All weights registers initialize to +1, tog_mux reset to 0 and X registers initialize to 0. The AU is also cleared by this bit.

5: Toggle input multiplexer control to the Arithmetic Unit (AU)

6: Cumulative Stage Gain Control counter

7: TBA

The above bits are active high.

SHRO Command

This command executes a 2-bit right shift in the adgen offset register of all selected adgen's in N (bits 3:0). N is defined as follows:

0: adgen0

1: adgen1

2: adgen2

3: adgen3

An adgen shift is executed when the corresponding bit is set.

Adgen Accumulate Address Base_Count

This command adds 2×N[7:0] to the current content of address offset register in adgen(s) specified by adg[2:0] as follows:

Adg[0]→adgen0

Adg[1]→adgen1

Adg[2]→adgen3

A value of '1' in corresponding adgen position causes the counter to update.

Loop Instructions

Loop instructions are specially designed to operate in a tight loop with no overhead clock cycles to administer the loop. A loop is started with the first instruction following a Loop Start instruction and ends with, either a Loop_end instruction or a field within the Multi-Move instruction. The Multi-Move instruction has a Loop Eval field (bit 26), which facilitates monitoring loop execution with zero overhead, this feature is available only within loop 0. Up to four loops can be nested. Loops 1-3 must use the Loop_End$_i$ command to signal the end of the loop, while loop 0 may use the Loop_end0 instruction or the Loop Eval field. A loop must contain a minimum of 3 instructions in order to meet the timing requirements of a tight loop with no overhead. When multiple loops are used concentrically, the outermost should be loop 3 and the innermost should be loop 0.

Registered Command Instruction (RCMD)

This instruction facilitates the access to an 8-bit register that may be customized by the user. The value of N is directly written to the RCMD register. In the context of an FFT application, the 8 bits are defined as follows:

TABLE 5

RCMD instruction

| Bit | Function | Description |
|---|---|---|
| 0 | Blank_SPM | Zero out scratch pad memory during reads |
| 1 | | TBD |
| 2 | | TBD |
| 3 | | TBD |
| 4 | Start_bfly | Soft start of program execution |
| 5 | | TBD |
| 6 | | TBD |
| 7 | | TBD |

Multiple-Function 32-Bit Instructions

Multi-Move Single Instruction

There is no specific syntax for this instruction, but a combination of two or three move instructions compose this operation.

TABLE 6

| Specialized Instructions | | | | | | | | | | | | | |
|---|---|---|---|---|---|---|---|---|---|---|---|---|---|
| 31-29 | 28 | 27 | 26 | 25-23 | 22-19 | 18-16 | 15-14 | 13 | 12-9 | 8-5 | 4 | 3 | 2-0 |
| 000 | AddOfs | Tog | LpEv | Vw Vy Vx | Wmem CTR Setting | W Dest | 01 | Y Src | Ymem CTR Setting | Xmem CTR Setting | Ymem Dest | Xmem Src | X Dest. |
| 010-111 | | | | | | | Reserved | | | | | | |

31-29: OP Code for multiple-function Move instruction.

28: "Add Offset to i-counter" enable for X, Y and W counters. This bit, when set, along with the auto-increment bit, will cause the i-counter new value to equal the old value plus the offset register content. This bit is decoded in conjunction with each adgen's auto-increment bit.

27: Causes input mux to AU to toggle when set.

26: Loop evaluate bit to ensure smooth transitioning to the beginning of a loop.

25-23: Vw, Vy and Vx active-high bits that validate the move instructions from Weights/Constants memory to W registers, from AU's Y output to memory and from input memory to X registers.

22-19: control setting for address generator counter to Weights/Constants memory; used in W-to-register move instruction.

18-16: Destination address for W register. Decode is as follows:

| [18:16] | Register |
|---|---|
| 001 | W1 Low |
| 010 | W2 Low |
| 011 | W3 Low |
| 100 | W1 High |
| 101 | W2 High |
| 110 | W3 High |
| 000, 111 | Reserved |

15-14: OP Code for multiple function instructions.

13: Source data for Y-to-memory move instruction, 0 for Y0 and 1 for Yn [Y is the Arith. Unit output].

12-9: control setting for address generator counter to output memory; used in Y-to-memory move instruction.

8-5: control setting for address generator counter to input memory; used in memory-to-X-register move instruction.

4: selects between high and low memories (MEMout) to which Y output is written (0=low and 1=high.)

3: selects between high and low memories (MEMin) from which data is fetched for writing to X registers (0=low and 1=high.)

2-0: X-register destination used in memory-to-X-register move instruction. Decode is as follows:

| [2:0] | Register |
|---|---|
| 000 | X0 Low |
| 001 | X1 Low |
| 010 | X2 Low |
| 011 | X3 Low |
| 100 | X0 High |
| 101 | X1 High |
| 110 | X2 High |
| 111 | X3 High |

General Form of CTR Setting Bits:

[0] auto-increment of i-counter

[1] selection of i (1) or j (0) counter to connect to output

Figure 10:
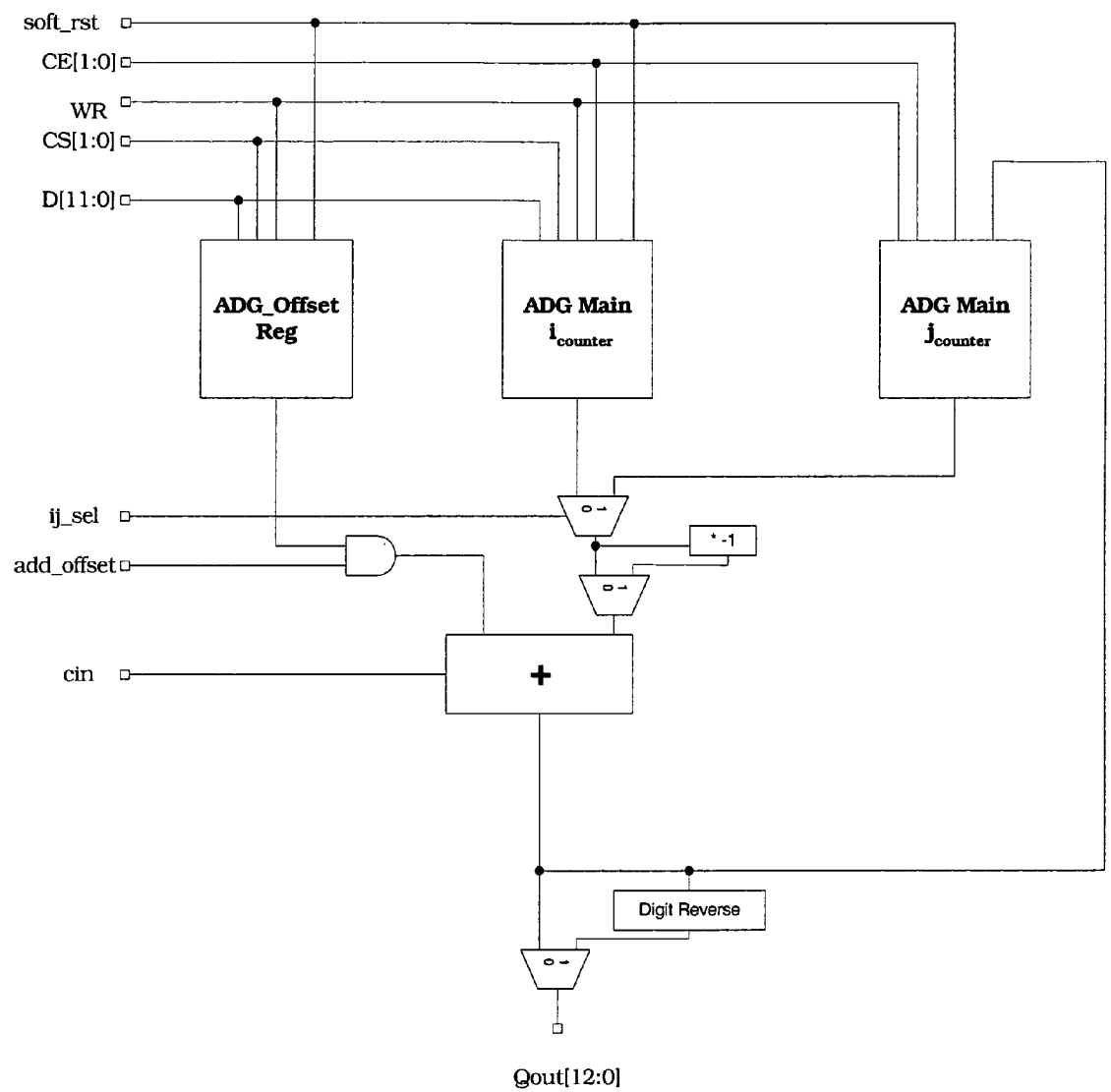
FIG. 10 shows an exemplary memory address generation circuit in accordance with an embodiment of the present invention.

[3:2] addressing mode: 00→RSC(i) or j
    01→RSC(i+1) or j
    10→RSC(i++) or j
    11→RSC(i++1) or j where RSC≡Resource. FIG. 10 shows a memory address generation circuit in accordance with an embodiment of the present invention.

i=the current value of $i_{counter}$ in a given ADG.

j=the current value of $j_{counter}$ in a given ADG.

++≡output is the sum of the specified counter and the offset register in a given ADG.

A 6-bit command is passed to the ADGEN and is defined as follows:

| Ccnt | function |
|---|---|
| 0 | icnt ce |
| 1 | jcnt ce |
| 2 | ij_sel |
| 3 | add 1 |
| 4 | add offset |
| 5 | shift add_offset 2 bits to the right. |

Loop Start Instructions

TABLE 7

| Loop Configuration Instruction | | | | |
|---|---|---|---|---|
| 31-29 | 28-20 | 19-16 | 15-14 | 13-0 |
| 001 | x xxxx xxxx | Loop ID | 01 | Loop repeat count |
| 010-111 | | Reserved | | |

31-29: OP Code for loop start and loop address instruction.

28-20: Unused bits.

19-16: Four concentric loops are available, Loop3-Loop0. These bits identify the loop being set up as follows:

| [19-16] | Loop no. |
|---|---|
| 0001 | 0 |
| 0010 | 1 |
| 0100 | 2 |
| 1000 | 3 |

15-14: OP Code for multiple function instructions.

13-0: This number specifies how many times this loop is repeated.

The following nomenclature is used in describing the Adgen desired behavior:
    i≡the current value of $i_{counter}$ in a given ADG.
    j≡the current value of $j_{counter}$ in a given ADG.
    ++≡output is the sum of the specified counter and the offset register in a given ADG.
    ^≡increment the specified counter at the next clock cycle.
    ML, MH≡configured input memories The Data Interface Module (DIF) interfaces external data to either the ping-pong input buffers of the FFT or the single IFFT input buffer. This module's operation is controlled by a 4-bit configuration register: Dif_cfgr which is mapped at indirect address 0x40 (see Table 2).

| Bit(s) | Mnemonic | Function |
|---|---|---|
| 2:0 | Amsb | Identifies the most-significant bit in the generated address to the input memory buffer according to the following map:<br>000 → Daddr[6] 001 → Daddr[7]<br>010 → Daddr[8] 011 → Daddr[9]<br>100 → Daddr[10] 101 → Daddr[11]<br>110, 111 → Daddr[12]<br>Amsb corresponds to physical memory space with LSB address bit connected to select between Real and Imaginary parts of memory. |
| 4:3 | Wrmode | 0 → input data is written exclusively to the real input memory buffer and 0 is written into the imaginary input memory buffer, used address bits are Daddr[N:0]<br>1 → input data is alternated between the real and the imaginary input buffer memory, starting with |

-continued

| Bit(s) | Mnemonic | Function |
|---|---|---|
| | | the imaginary buffer then the real buffer. Address bits used are Daddr[N:1] and Daddr[0] is to select real/imaginary memory. 2 → input data is alternated between the real and the imaginary input buffer memory, starting with the real buffer then the imaginary buffer. Address bits used are Daddr[N:1] and Daddr[0] is to select real/imaginary memory. 3 → input data is written to both real and imaginary memory buffers of the FFT and IFFT. |
| 7:5 | Phyamsb | Identifies the most-significant address bit in each half of the input memory buffer required to fill in the received FFT frame according to the following map: 000 → Daddr[6] 001 → Daddr[7] 010 → Daddr[8] 011 → Daddr[9] 100 → Daddr[10] 101 → Daddr[11] 110, 111 → Daddr[12] |

Figure 11:
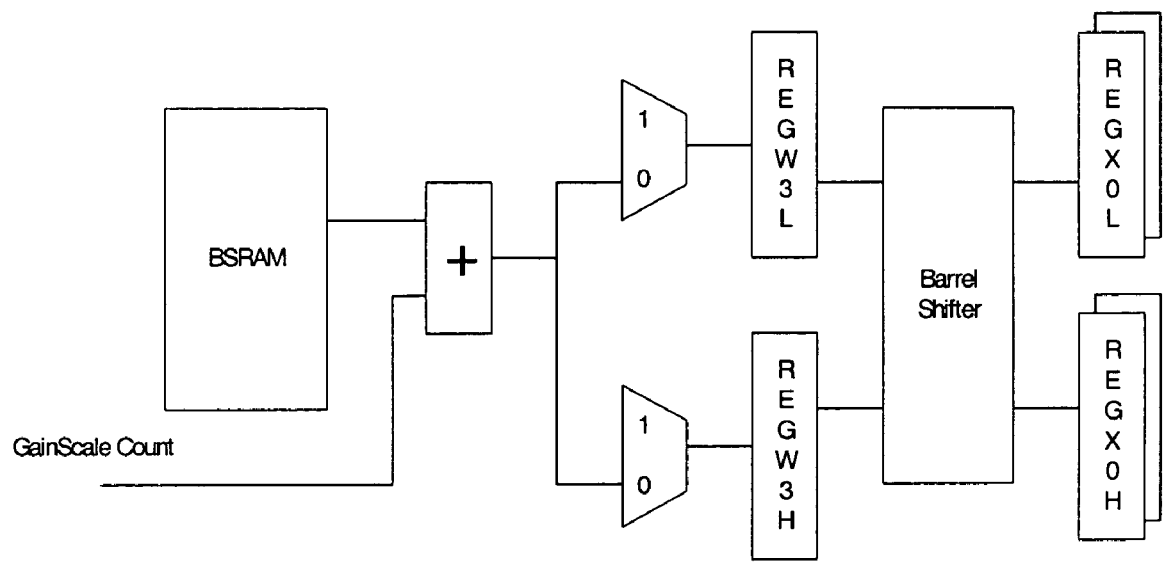
FIG. 11 shows an exemplary barrel shifter circuit in accordance with an embodiment of the present invention.

With reference to FIG. 11, the following is a discussion of barrel shifting operation. The OPR BRLS instruction invokes barrel shifting operation. Similar to the execution of an FFT/IFFT stage, this operation is setup as a zero-overhead loop of moving a barrel-shift component from BSRAM into W3L and W3H, simultaneously with in-place data moved to the register pairs X0L(re, im) and X0H(re, im). Transparent to the user is the fact that the shift component is added to the value of the cumulative gain-scale shift that accrues during the FFT in-place stage operations.

The Barrel Shifter is located inside the AU and shares its Y0 output, therefore, the results can be written to the AU's output resources. The Barrel Shifter serves to combine two functionalities. First, it compensates for the automatic overflow protection explained earlier. This function is done as an internal capability of the engine. Second, The Barrel Shifter can perform the exponent part of a large scale factor. These two functions are combined together in the Barrel Shifter. The Barrel Shifter is capable of shifting up to 12 positions to the left, no shift or up to 2 positions to the right. The shift instruction fetched from the BSRAM is coded as shown in Table 8. Vacated bits are filled with 0's on LSB side and sign-extended on the MSB side. Note that since the shift instruction code exceeds the maximum right shift, it is expected that the sum of this shift code and the gain scale count will yield a value in the range of −2 to +12, which is the range supported by the barrel shifter. If the supported range is exceeded, the maximum shift in the desired direction will apply.

TABLE 8

Barrel Shifter Encoding

| Shift Instruction Code | Action |
|---|---|
| 00000 | No shift |
| 00001 | Shift to the Left 1 bit position |
| 00010 | Shift to the Left 2 bit positions |
| 00011 | Shift to the Left 3 bit positions |
| 00100 | Shift to the Left 4 bit positions |
| 00101 | Shift to the Left 5 bit positions |
| 00110 | Shift to the Left 6 bit positions |
| 00111 | Shift to the Left 7 bit positions |
| 01000 | Shift to the Left 8 bit positions |
| 01001 | Shift to the Left 9 bit positions |
| 01010 | Shift to the Left 10 bit positions |
| 01011 | Shift to the Left 11 bit positions |
| 01100 | Shift to the Left 12 bit positions |
| 11110 | Shift to the Right 2 bit positions |
| 11111 | Shift to the Right 1 bit position |

The following is an exemplary loop of long move instructions for performing a barrel shift operation in an embodiment of the present invention:

```
OPR BRLS ;                                       Tog    $
Mov BSR(i++), W0                                        $
Rep 1024 (
Mov BSR(i^), W0 ; Mov Y0, MH(i++^);      Tog    $
Mov BSR(i++^), W0;       Mov Y0, ML(i^);   Tog  $ // Loop eval.
)
```

It should be noted that W0 corresponds to a value of 0 in bit positions 18-16 of the long move instruction. BSR is the barrel shift RAM and is addressed by ADGEN assigned to the weights memory.

The following is a discussion of post twiddle and gain scaling in receivers. The required Post-Twiddle terms are:

$$Re(v)=RP(v)+IP(v)*\cos(\pi v/N)-RM(v)*\sin(\pi v/N)$$

$$Re(N-v)=RP(N-v)-IP(N-v)*\cos(\pi v/N)+RM(N-v)*\sin(\pi v/N)$$

$$Im(v)=IM(v)-RM(v)*\cos(\pi v/N)-IP(v)*\sin(\pi v/N)$$

$$Im(N-v)=-IM(N-v)-RM(N-v)*\cos(\pi v/N)-IP(N-v)*\sin(\pi v/N)$$

Figure 12:
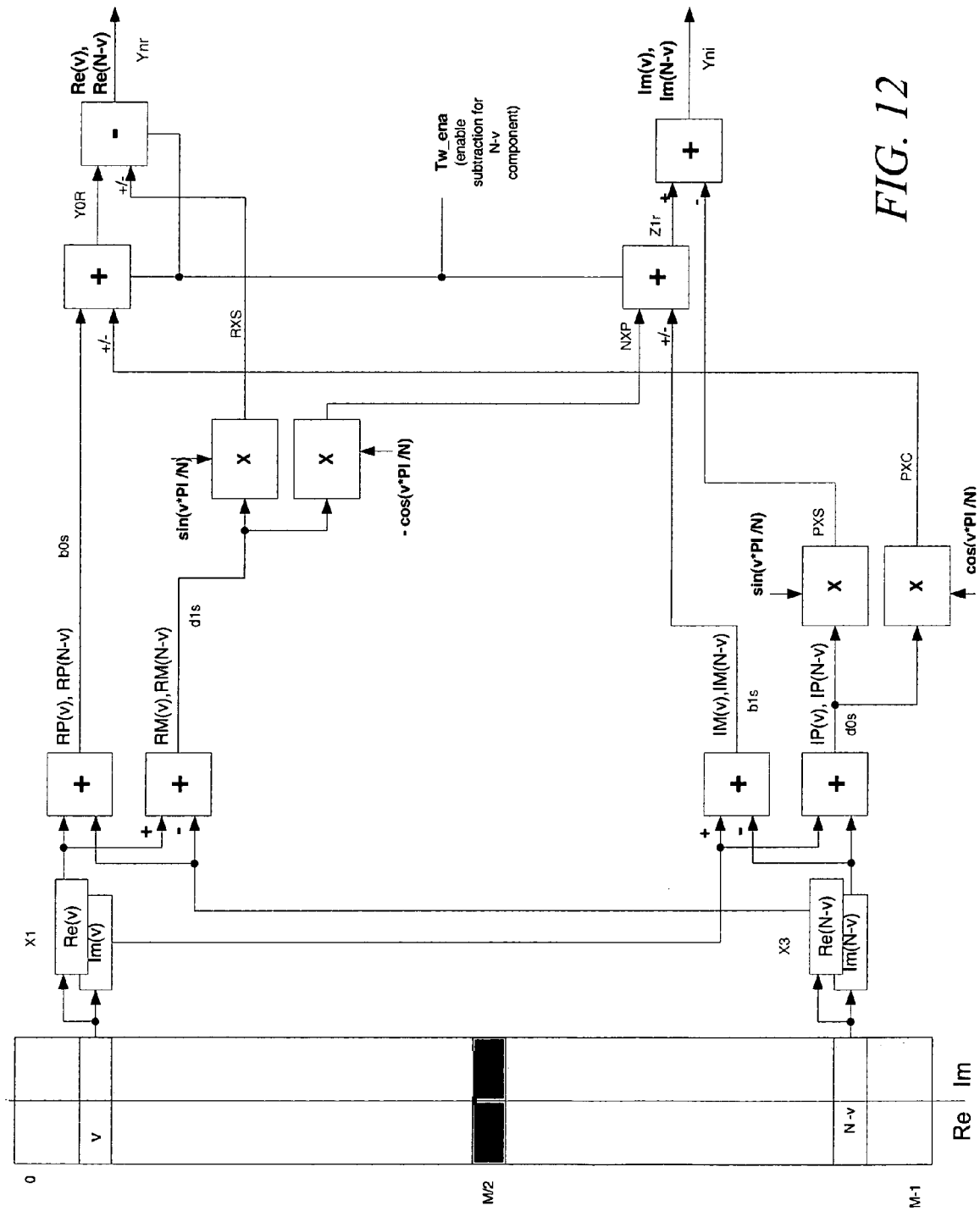
FIG. 12 shows an exemplary engine configuration for performing a Radix-4 post-twiddle operation in accordance with an embodiment of the present invention.
Figure 13:
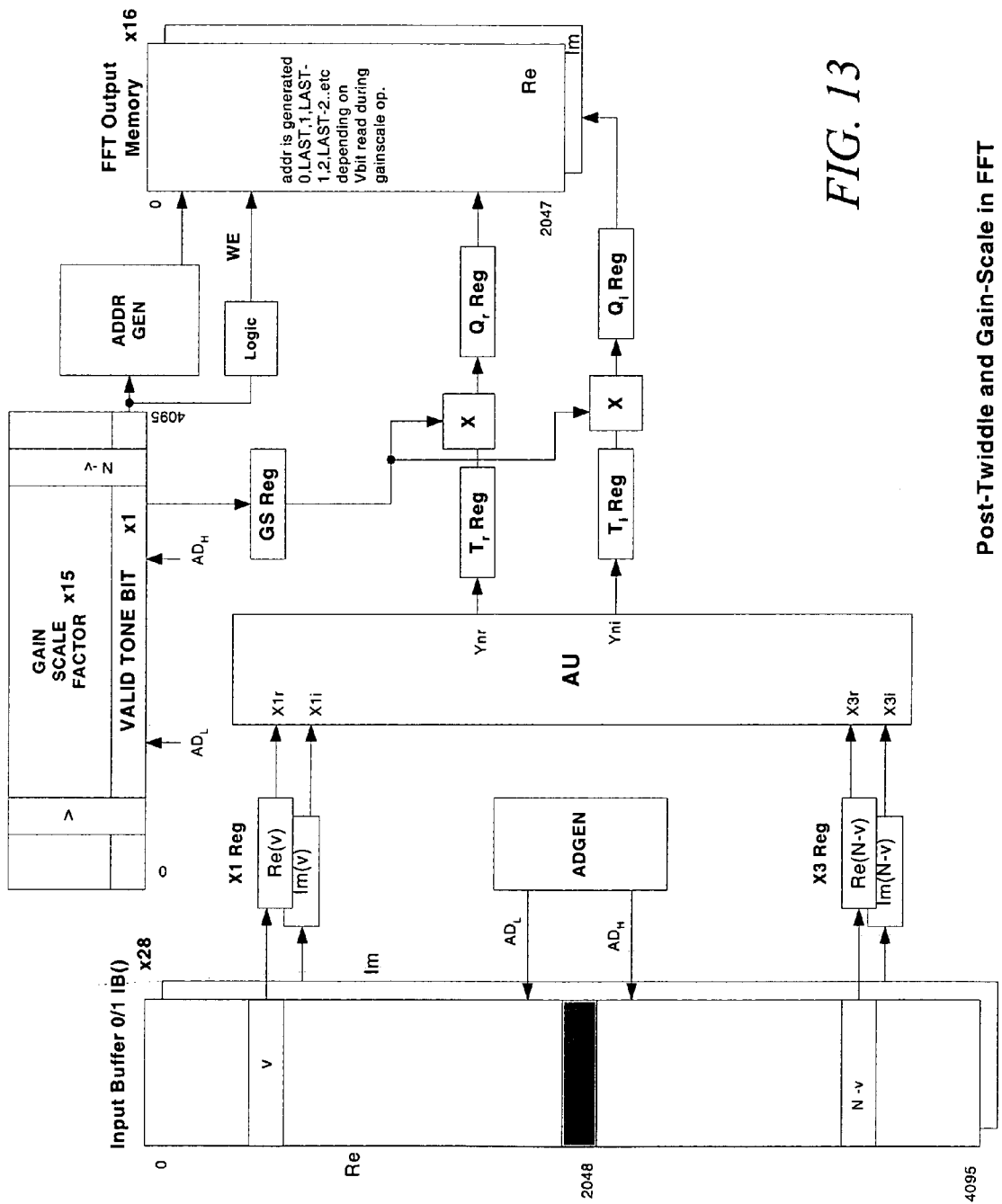
FIG. 13 shows a receiver's review of the twiddle and gain-scale operation in accordance with an embodiment of the present invention.
Figure 14:
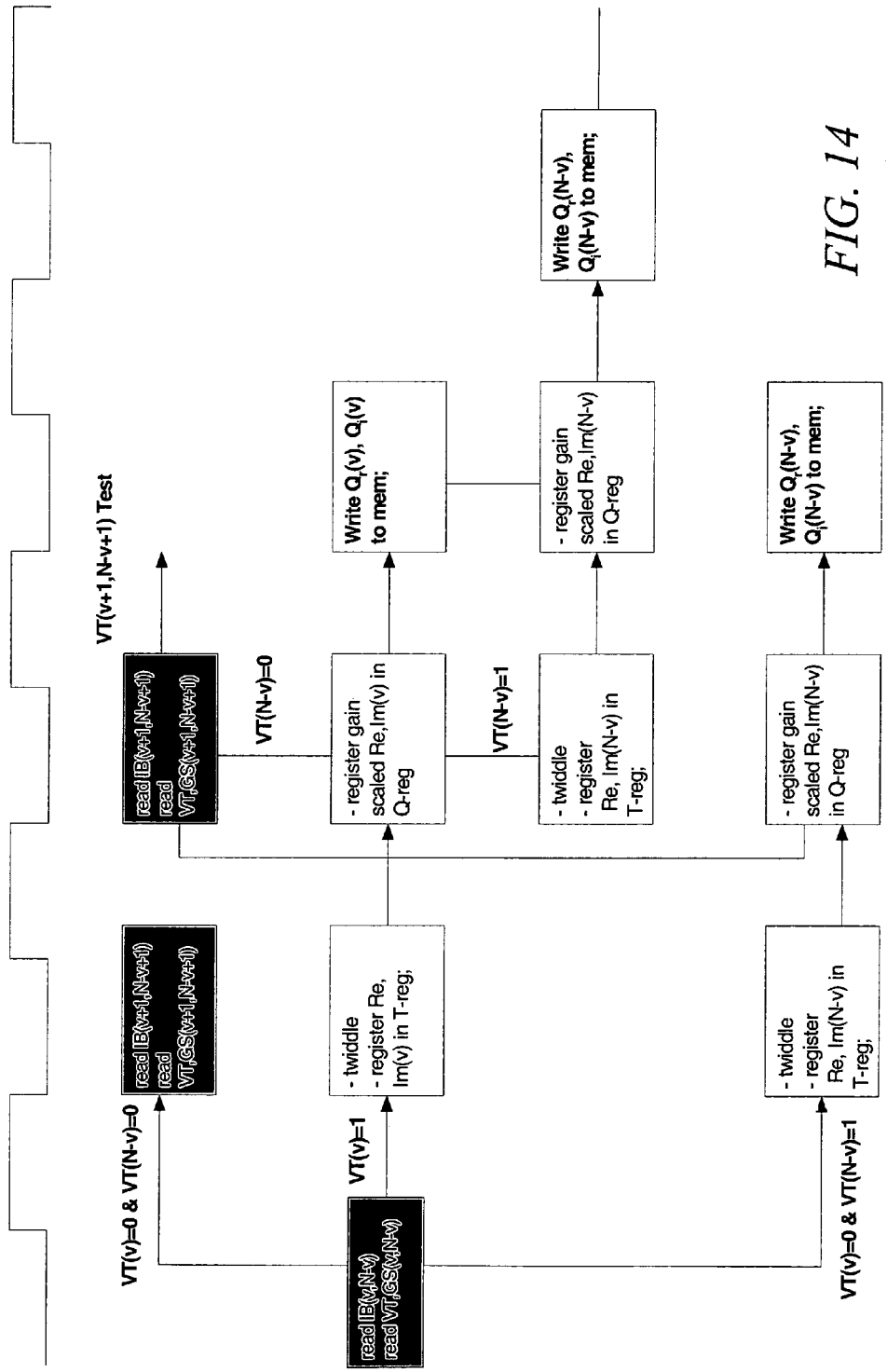
FIG. 14 shows a timeline for operations performed after the post-twiddle operation in accordance with an embodiment of the present invention.

The architecture of a discrete post twiddle implementation is shown in FIG. 12. Note that the structure has been included in the ER4 design and the twiddle is computed as the last stage in an FFT operation. A receiver's view of twiddle and gain-scale implementation is depicted in FIG. 13. Although ER4 can perform gain scale operations, in VDSL the frame time is too short for the engine to do the computation and keep an adequate spare margin. The addition of a pair of multipliers optimizes the gain scale and writing out of results as shown in FIG. 13. The timeline of operations done after the post-twiddle is shown in FIG. 14.

The AU generates Post-Twiddle outputs as follows:

$$Yni(v)=Z1r-B1$$

$$Yni(N-v)=-Z1r-B1$$

Given that the pair of points used are x(v) and x(N−v). Similarly for the real components:

$$Ynr(v)=Y0r-B0$$

$$Ynr(N-v)=Y0r+B0$$

The engine differentiates between the above pairs by recognizing a write from AU Y-output to in-place memory with addressed location (i) versus location (i++). This circuitry is invoked in Twiddle functions only.

Figure 15:
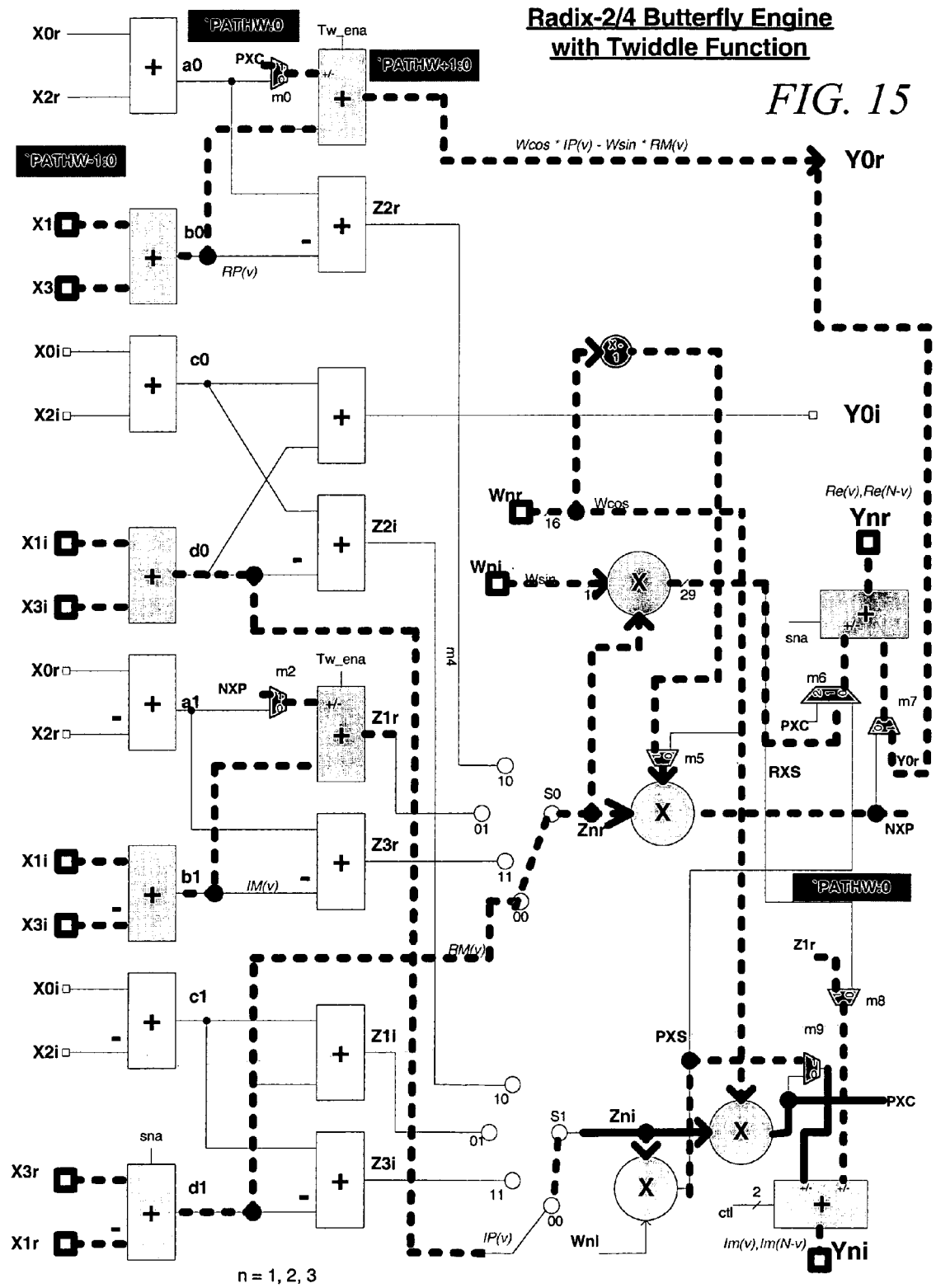
FIG. 15 shows the twiddle function datapath in accordance with an embodiment of the present invention.

FIG. 15 shows the twiddle function datapath in accordance with an embodiment of the present invention.

Figure 16:
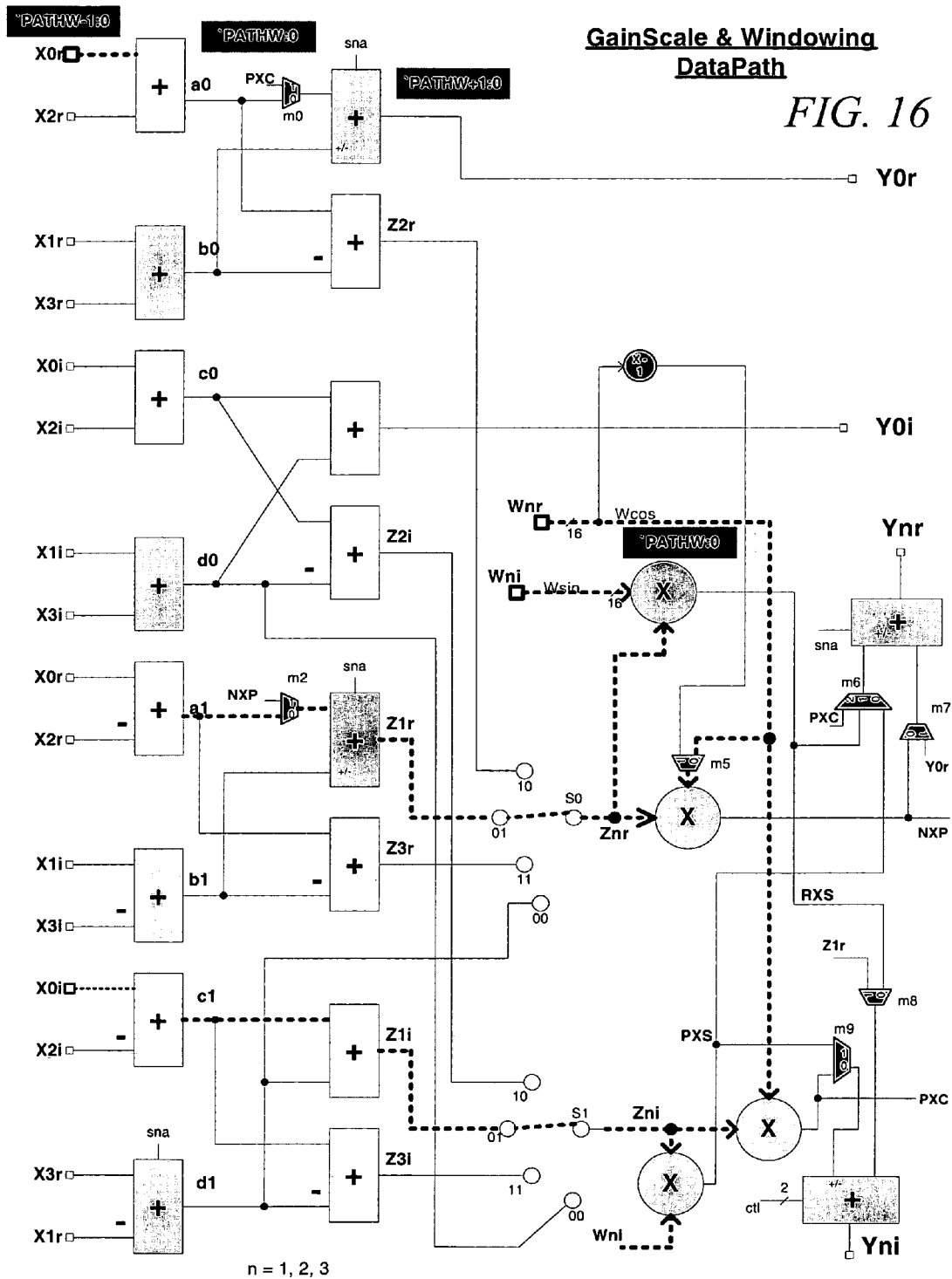
FIG. 16 shows the gain-scale and windowing datapath in accordance with an embodiment of the present invention.

FIG. 16 shows the gain-scale and windowing datapath in accordance with an embodiment of the present invention.

Figure 17:
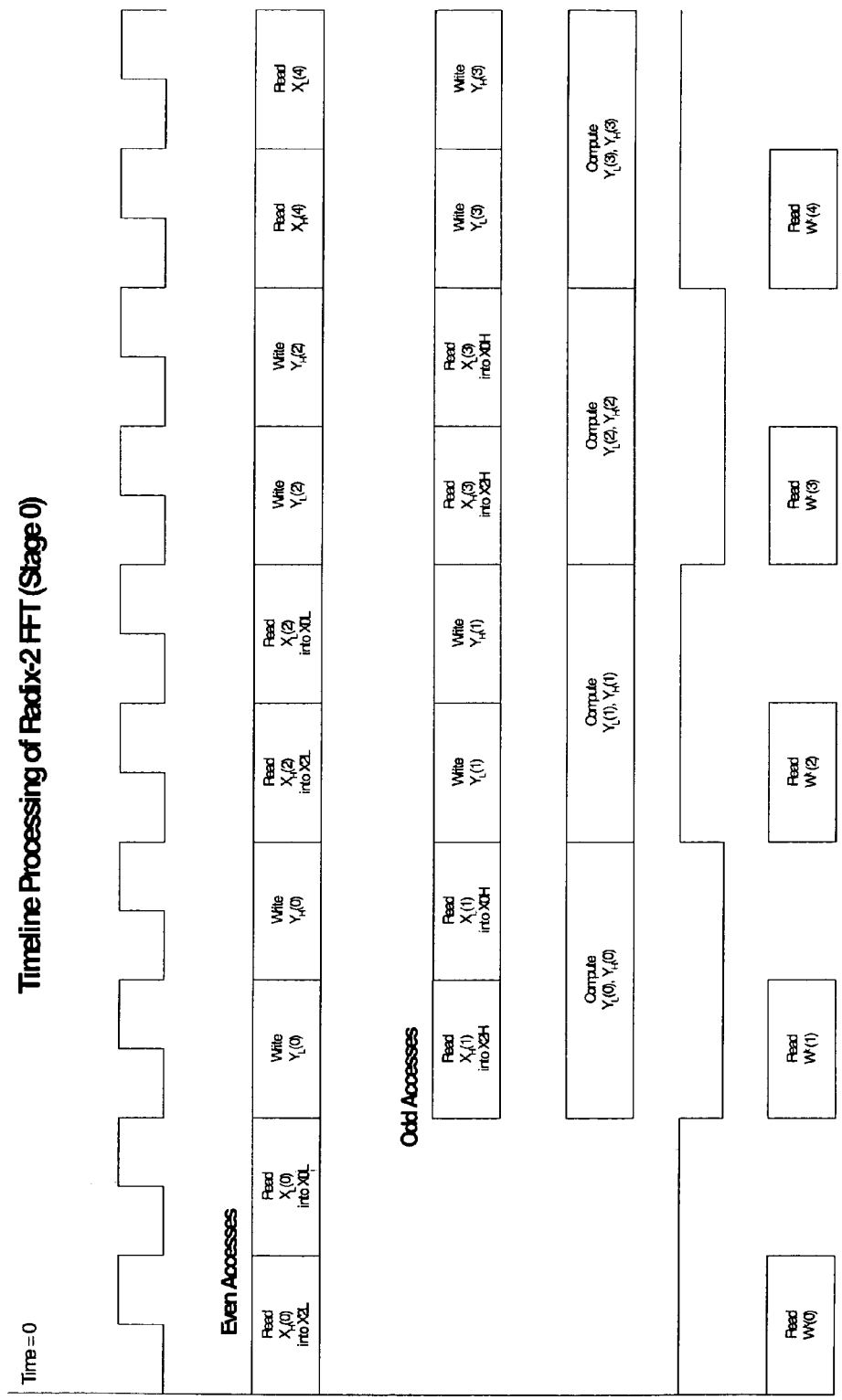
FIG. 17 shows a timeline for a Radix-2 FFT operation in accordance with an embodiment of the present invention.

FIG. 17 shows the timeline of Radix-2 FFT in accordance with an embodiment of the present invention.

Figure 18:
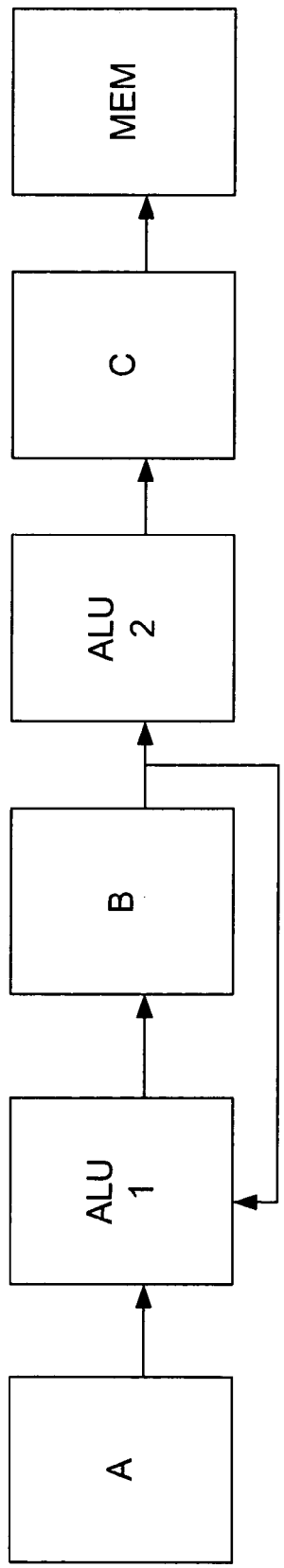
FIG. 18 shows one exemplary engine core with feedback in which the output of Register B is fed back to the first ALU such that the first ALU can operate on the contents of Register A and/or the contents of Register B and store the result in Register B, in accordance with an embodiment of the present invention.
Figure 19:
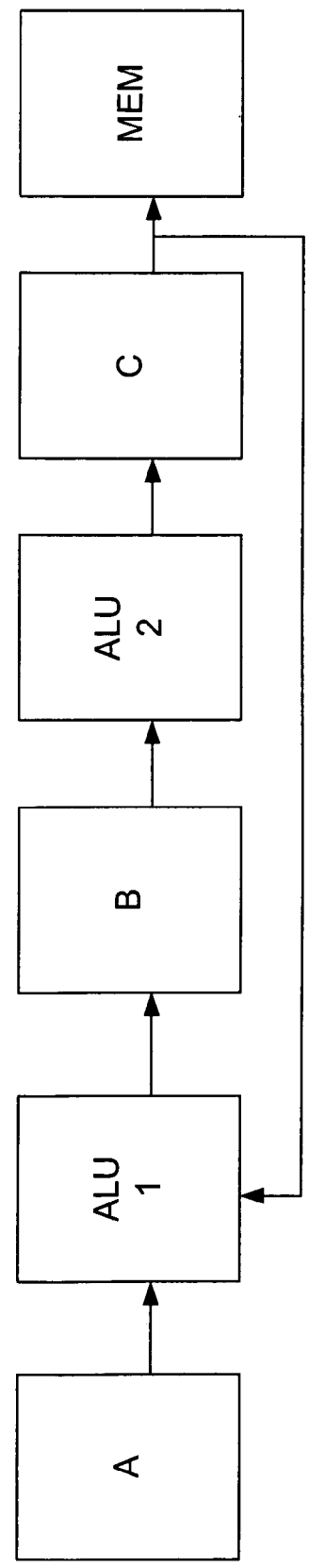
FIG. 19 shows another exemplary engine core with feedback in which the output of Register C is fed back to the first ALU such that the first ALU can operate on the contents of Register A and/or the contents of Register C and store the result in Register B, in accordance with an embodiment of the present invention.
Figure 20:
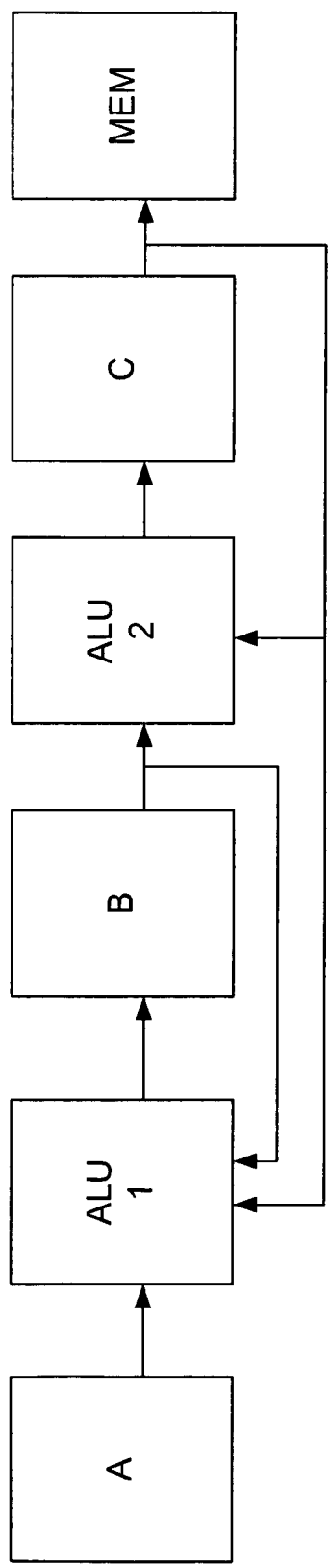
FIG. 20 shows another exemplary engine core with feedback in which the output of Register B is fed back to the first ALU and the output of Register C is fed back to the first ALU and the second ALU such that the first ALU can operate on the contents of Register A, Register B, and/or Register C and store the result in Register B and the second ALU can operate on the contents of Register B and/or Register C and store the output in Register C, in accordance with an embodiment of the present invention.
Figure 21:
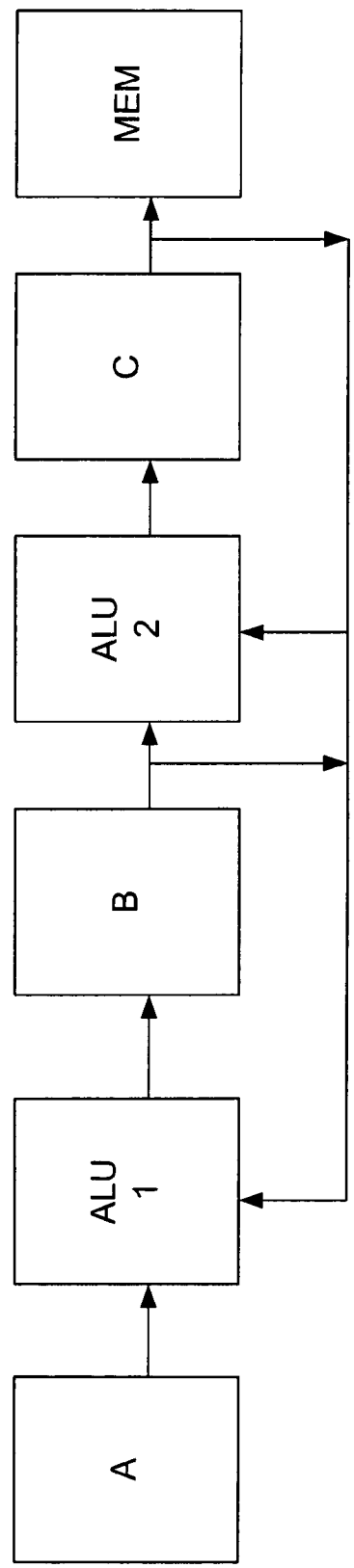
FIG. 21 shows an exemplary engine core with both feedback and feed-forward such that each ALU can operate on any combination of the registers, in accordance with an embodiment of the present invention.

As discussed above, the programmable engine core may include feed-backs and feed-forwards from certain registers back to previous ALUs. FIG. 18 shows one exemplary engine core with feedback in which the output of Register B is fed back to the first ALU such that the first ALU can operate on the contents of Register A and/or the contents of Register B and store the result in Register B. FIG. 19 shows another exemplary engine core with feedback in which the output of Register C is fed back to the first ALU such that the first ALU can operate on the contents of Register A and/or the contents of Register C and store the result in Register B. FIG. 20 shows another exemplary engine core with feedback in which the output of Register B is fed back to the first ALU and the output of Register C is fed back to the first ALU and the second ALU such that the first ALU can operate on the contents of Register A, Register B, and/or Register C and store the result in Register B and the second ALU can operate on the contents of Register B and/or Register C and store the output in Register C. FIG. 21 shows an exemplary engine core with both feedback and feed-forward such that each ALU can operate on any combination of the registers.

Thus, certain embodiments of the present invention include a programmable engine core. The programmable engine core typically includes one or more ALUs situated between registers or other storage constructs. The ALUs are programmed or otherwise configured to perform certain operations upon data that is moved into the ALUs. Different ALUs can be programmed or configured to perform different operations.

Certain embodiments of the present invention employ "ping-pong" buffers. Among other things, the ping-pong buffers allow data to be written into one buffer when data is being read from the other buffer, thereby facilitating parallel operations.

Certain embodiments of the present invention dynamically allocate scratchpad memory to the ping-pong input buffer. As shown in FIG. 9, there are preferably two 16-bit wide ping-pong memories, a 2-bit wide and a 12-bit wide scratch pad memory. This is a part of the memory management scheme within the engine. The scratch pad memory is used to enhance the internal precision of the engine without the need to increase the word-length across the board for all memory buffers. The scratch pad has the dynamic overflow protection bits and the extra precision bits. During processing stages, the scratch pad affords a wider word length for reduced round-off errors. The output stage rounds off and stores the results in the output memory. The 2-bit page of the scratch pad precedes and the 12-bit page from the rest of the scratch pad memory is appended to the ping-pong memory being used. The 2 bits are sign extension bits and the 12 bits increase the computational resolution. The scratch pad saves memory.

Certain embodiments of the present invention employ a dynamic overflow protection scheme to detect arithmetic overflow conditions. Specifically, there are some number of sign extension bits (greater than or equal to two sign extension bits), with one value (e.g., all zeros) used for positive values and another value (e.g., all ones) used for negative values. In the course of performing certain arithmetic computations, the sign extension bits are checked. If the value of the sign extension bits have changed, then an overflow condition exists, in which case the entire data set is typically scaled back. By using sign extension values of all zeros and all ones, the logic used to detect overflow conditions is relatively simple.

Certain embodiments of the present invention employ sine/cosine lookup tables to obtain sine/cosine values for various arithmetic computations. In preferred embodiments, rather than storing sine/cosine values for an entire wave, values are only stored for a portion of the wave (e.g., one eighth or one quarter), and missing values are computed from those stored values, specifically by taking advantage of the symmetries of the sine/cosine waves. Computations can be done in 1 clock cycle.

The present invention may be embodied in many different forms, including, but in no way limited to, programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof.

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL).

Programmable logic may be fixed either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), or other memory device. The programmable logic may be fixed in a signal that is transmittable to a computer using any of various communication technologies, including, but in no way limited to, analog technologies, digital technologies, optical technologies, wireless technologies (e.g., Bluetooth), networking technologies, and internetworking technologies. The programmable logic may be distributed as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

The present invention may be embodied in other specific forms without departing from the true scope of the invention. The described embodiments are to be considered in all respects only as illustrative and not restrictive.

What is claimed is:

1. Apparatus for digital signal processing comprising:
a first plurality of programmable filter elements, at least one of said first plurality of programmable filter elements having a first microcode control program for internal control of the programmable filter element;
first programmable interconnection logic coupled to the first plurality of programmable filter elements for selectively combining, scaling, and accumulating output values from the first plurality of programmable filter elements and selectively providing accumulated values as inputs to the first plurality of programmable filter elements; and
a first filter controller coupled to the first plurality of programmable filter elements and the first programmable interconnection logic, the first filter controller having a second microcode control program for external control of the first plurality of programmable filter elements and the first programmable interconnection logic.

2. Apparatus according to claim 1, wherein the first programmable interconnection logic comprises:
a plurality of registers, each register capable of being selectively coupled to at least one programmable filter element inputting data to the programmable filter element or receiving data from the programmable filter element.

3. Apparatus according to claim 2, further comprising:
a data memory coupled to at least one of the registers for outputting data to the register or receiving data from the register.

4. Apparatus according to claim 3, wherein at least one of the plurality of registers can be selectively coupled to input data to a programmable filter element and receive data from the same programmable filter element.

5. Apparatus according to claim 3, wherein at least one of the plurality of registers can be selectively coupled to input data to one programmable filter element and receive data from a different programmable filter element.

6. Apparatus according to claim 3, wherein at least one of the plurality of registers can be selectively coupled to input data to multiple programmable filter elements.

7. Apparatus according to claim 1, wherein the first filter controller comprises:
an instruction memory for storing the second control program; and
at least one instruction decoder coupled to the instruction memory for programming the first plurality of programmable filter elements and the first programmable interconnection logic based on the second control program.

8. Apparatus according to claim 1, wherein the first filter controller comprises a plurality of program counters for running different iterations of the second control program for different filter elements.

9. Apparatus according to claim 1, wherein the first filter controller comprises a plurality of loop counters for running different iterations of second control program loops for different filter elements.

10. Apparatus according to claim 1, wherein the first programmable interconnection logic comprises:
a multiplexer coupled to the first plurality of programmable filter elements for selectively driving output values received from the first plurality of programmable filter elements;
a barrel shifter coupled to the multiplexer for receiving the values and selectively scaling the values according to a scaling factor programmed by the first filter controller; and
at least one accumulator coupled to the barrel shifter for selectively accumulating scaled values from the barrel shifter.

11. Apparatus according to claim 10, wherein the first programmable interconnection logic further comprises:
programmable feedback logic coupled to the at least one accumulator and to the first plurality of filter elements for selectively providing the accumulated values as inputs to the first plurality of programmable filter elements.

12. Apparatus according to claim 1, wherein at least one programmable filter element having a first microcode control program comprises:
a second plurality of programmable filter elements;
second programmable interconnection logic coupled to the second plurality of programmable filter elements for selectively combining, scaling, and accumulating output values received from the second plurality of programmable filter elements and selectively providing accumulated values as inputs to the second plurality of programmable filter elements; and
a second filter controller coupled to the second plurality of programmable filter elements and the second programmable interconnection logic for controlling the second plurality of programmable filter elements and the second programmable interconnection logic according to the first control program.

13. Apparatus according to claim 1, wherein at least one of the first plurality of programmable filter elements comprises:
at least one memory for storing data samples and coefficients;
a multiplier for multiplying data samples read from the at least one memory with corresponding coefficients read from the at least one memory;
an accumulator for summing multiplier outputs; and control logic for controlling the at least one memory, the multiplier, and the accumulator, the control logic logically shifting the data samples read from the at least one memory and writing the logically shifted data samples back into the at least one memory so as to emulate a shift register.

14. Apparatus according to claim 1, wherein the first filter controller allows each programmable filter element to operate independently to perform different filtering functions.

15. Apparatus according to claim 1, wherein the first filter controller allows operation of multiple programmable filter elements to be combined to perform a single filtering function.

16. Apparatus according to claim 1, wherein the first filter controller can implement a plurality of filters, each having a symbol rate, and wherein the repetitive execution, by the first filter controller, of a loop containing a number of single-clock instructions can be completed in the number of clocks that are required for execution of a symbol for the filter having the slowest symbol rate.

17. Apparatus according to claim 16, wherein, during each symbol period of the slowest symbol rate filter, filters with faster symbol rates than the slowest symbol rate filter can operate on multiple symbols.

18. Apparatus according to claim 16, wherein, during each symbol period of the slowest symbol rate filter, filters with faster symbol rates than the slowest symbol rate filter can complete execution of a symbol and then remain idle for the remainder of the symbol period.

19. Apparatus according to claim 1, wherein each microcode instruction in the instruction set of the first filter controller contains a clock field, and wherein the first filter controller applies software-generated clocks to the individual filter elements based on the clock field.

20. Apparatus according to claim 19, wherein a software-controlled clock can be generated by programming a value of one or zero in the clock field in each microcode instruction, such that the sequence of ones and zeros directly generate a plurality of symbol clocks at a frequency dictated by the sequence and the length of instruction loop.

21. Apparatus according to claim 1, wherein symbol clocks applied to the plurality of filter elements are dynamically selected via software and the frequencies are determined by a field in the instruction set of the first filter controller.

22. Apparatus according to claim 1, wherein each microcode instruction of the instruction set of the first filter controller contains a loop evaluation bit, and wherein the first filter controller evaluates the loop evaluation bit during the execution of each instruction.

23. Apparatus according to claim 1, further comprising:
a transceiver for transmitting and receiving communication signals, the transceiver providing signals to the plurality of programmable filter elements for digital signal processing and receiving processed signals from the plurality of programmable filter elements.

* * * * *